US012167647B2

United States Patent
Zhang et al.

(10) Patent No.: US 12,167,647 B2
(45) Date of Patent: Dec. 10, 2024

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Bo Zhang, Beijing (CN); Hongwei Ma, Beijing (CN); Xiangdan Dong, Beijing (CN); Bo Cheng, Beijing (CN); Rong Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 1135 days.

(21) Appl. No.: 16/977,533

(22) PCT Filed: Nov. 29, 2019

(86) PCT No.: PCT/CN2019/122128
§ 371 (c)(1),
(2) Date: Sep. 2, 2020

(87) PCT Pub. No.: WO2021/102971
PCT Pub. Date: Jun. 3, 2021

(65) Prior Publication Data
US 2022/0384556 A1 Dec. 1, 2022

(51) Int. Cl.
*H10K 59/131* (2023.01)
*H01L 21/66* (2006.01)

(52) U.S. Cl.
CPC ........... *H10K 59/131* (2023.02); *H01L 22/32* (2013.01)

(58) Field of Classification Search
CPC ...... H10K 59/131; H10K 50/88; H01L 22/32; H01L 27/0296
See application file for complete search history.

(56) References Cited

U.S. PATENT DOCUMENTS

| 8,063,865 B2 * | 11/2011 | Ishii | .................. G02F 1/136204 |
| | | | 345/98 |
| 11,296,125 B2 | 4/2022 | Huang | |

(Continued)

FOREIGN PATENT DOCUMENTS

| CN | 101221330 A | 7/2008 |
| CN | 103927963 A | 7/2014 |

(Continued)

OTHER PUBLICATIONS

International Search Report of PCT/CN2019/122128 in Chinese, mailed Jul. 28, 2020.

(Continued)

*Primary Examiner* — Kretelia Graham
*Assistant Examiner* — Jaesun Lee
(74) *Attorney, Agent, or Firm* — Collard & Roe, P.C.; William Collard

(57) ABSTRACT

A display substrate and a display device are provided. The display substrate includes a base substrate, the base substrate includes a display region and a periphery region; a plurality of data signal transmission lines, a plurality of signal output pads, a plurality of signal input pads, and a plurality of test pads are located in the periphery region; a plurality of sub-pixels and a plurality of data lines are located in the display region; the plurality of data signal transmission lines are electrically connected with at least part of the plurality of data lines; the periphery region is provided with a plurality of electrostatic release elements located between the plurality of signal output pads and the plurality of test pads, each electrostatic release element is electrically con- (Continued)

nected with one data signal transmission line and is configured to release static electricity on the data signal transmission line.

20 Claims, 17 Drawing Sheets

(56) References Cited

U.S. PATENT DOCUMENTS

| | | | |
|---|---|---|---|
| 2007/0045516 A1* | 3/2007 | Hong | G02F 1/13452 |
| | | | 250/208.1 |
| 2014/0191930 A1 | 7/2014 | Okumoto | |
| 2017/0031191 A1* | 2/2017 | Choi | H01L 22/32 |
| 2017/0352594 A1 | 12/2017 | Choi et al. | |
| 2018/0018910 A1* | 1/2018 | Jang | G09G 3/2092 |
| 2018/0122298 A1* | 5/2018 | Lee | H01L 27/124 |
| 2019/0214378 A1* | 7/2019 | Franck | G01R 31/002 |
| 2020/0328375 A1* | 10/2020 | Won | H10K 71/00 |
| 2020/0343270 A1 | 10/2020 | Huang | |
| 2021/0201719 A1* | 7/2021 | Lee | G06F 3/0412 |
| 2021/0305351 A1* | 9/2021 | Cho | H10K 50/80 |
| 2021/0358708 A1* | 11/2021 | Huang | H01H 57/00 |
| 2021/0407869 A1* | 12/2021 | Fu | H01L 27/124 |

FOREIGN PATENT DOCUMENTS

| | | |
|---|---|---|
| CN | 107589612 A | 1/2018 |
| EP | 3 001 404 A1 | 3/2016 |
| JP | 2013-225076 A | 10/2013 |
| KR | 10-0870663 B1 | 11/2008 |
| KR | 10-2013-0077189 A | 7/2013 |
| WO | 2019080433 A1 | 5/2019 |

OTHER PUBLICATIONS

Notice of Transmittal of the International Search Report of PCT/CN2019/122128 in Chinese, mailed Jul. 28, 2020.
Written Opinion of the International Searching Authority of PCT/CN2019/122128 in Chinese, mailed Jul. 28, 2020.
Extended European Search Report in European Application No. 19945440.6 dated Nov. 18, 2022.

* cited by examiner

DISPLAY SUBSTRATE AND DISPLAY DEVICE

CROSS REFERENCE TO RELATED APPLICATIONS

This application is the National Stage of PCT/CN2019/122128 filed on Nov. 29, 2019, the disclosure of which is incorporated by reference.

TECHNICAL FIELD

At least one embodiment of the present disclosure relates to a display substrate and a display device.

BACKGROUND

In the display industry, with the continuous development of technologies, an increasingly greater share of market has been moved to flexible organic light-emitting diode (OLED) display devices. In order to occupy a certain proportion in the future market competition, manufacturing enterprises think highly of the improvement in the product yield even more.

SUMMARY

At least one embodiment of the present disclosure relates to a display substrate and a display device.

At least one embodiment of the present disclosure provides a display substrate, including: a base substrate, including a display region and a periphery region at least located at one side of the display region; a plurality of sub-pixels, located in the display region; a plurality of data lines, located in the display region, the plurality of data lines being electrically connected with the plurality of sub-pixels; a plurality of data signal transmission lines, located in the periphery region, the plurality of data signal transmission lines being electrically connected with at least part of the plurality of data lines; a plurality of signal output pads, located in the periphery region and located between the plurality of data lines and the plurality of data signal transmission lines, the plurality of signal output pads being electrically connected with the plurality of data lines, the plurality of data signal transmission lines being electrically connected with at least part of the plurality of signal output pads; a plurality of signal input pads, located in the periphery region and located at a side of the plurality of signal output pads away from the display region, the plurality of signal output pads and the plurality of signal input pads being configured to be bonded with a signal input element; a plurality of test pads, located between the plurality of signal output pads and the plurality of signal input pads, the plurality of test pads being connected with the plurality of data signal transmission lines, respectively, the plurality of test pads being configured to be connected with an external test device during a manufacturing process of the display substrate to detect the display substrate; and a plurality of electrostatic release elements, located between the plurality of signal output pads and the plurality of test pads, the plurality of electrostatic release elements being connected with the plurality of data signal transmission lines, respectively, each of the plurality of electrostatic release elements being configured to release static electricity on the data signal transmission line that is connected with the electrostatic release element.

In one or more embodiment of the present disclosure, the electrostatic release element includes a first thin film transistor, a second thin film transistor, a first signal line, and a second signal line; the first thin film transistor is connected with one data signal transmission line of the plurality of data signal transmission lines and is connected with the first signal line, respectively; and the second thin film transistor is connected with the data signal transmission line and the second signal line, respectively.

In one or more embodiment of the present disclosure, the first thin film transistor includes a first electrode and a second electrode, one of the first electrode and the second electrode is connected with the data signal transmission line, and the other one of the first electrode and the second electrode is connected with the first signal line; and the second thin film transistor includes a third electrode and a fourth electrode, one of the third electrode and the fourth electrode is connected with the data signal transmission line, and the other one of the third electrode and the fourth electrode is connected with the second signal line.

In one or more embodiment of the present disclosure, the first thin film transistor further includes a first gate electrode, one of the first electrode and the second electrode is connected with the first gate electrode in a short circuit; and the second thin film transistor further includes a second gate electrode, one of the third electrode and the fourth electrode is connected with the second gate electrode in a short circuit.

In one or more embodiment of the present disclosure, the first thin film transistor further includes a first semiconductor layer, the first electrode and the second electrode are electrically connected with the first semiconductor layer, respectively; and the second thin film transistor further includes a second semiconductor layer, the third electrode and the fourth electrode are electrically connected with the second semiconductor layer, respectively.

In one or more embodiment of the present disclosure, a width-to-length ratio of a channel of the first semiconductor layer is in a range of 0.2-0.5, and a width-to-length ratio of a channel of the second semiconductor layer is in a range of 0.2-0.5.

In one or more embodiment of the present disclosure, at least one sub-pixel of the plurality of sub-pixels includes a thin film transistor; the thin film transistor includes an active layer located on the base substrate, a gate electrode located at a side of the active layer away from the base substrate, and a source electrode and a drain electrode that are located at a side of the gate electrode away from the base substrate; the first signal line, the second signal line, the first gate electrode, and the second gate electrode are located in a same layer as the gate electrode; and the first electrode, the second electrode, the third electrode, the fourth electrode, and the plurality of data signal transmission lines are located in a same layer as the source electrode of the thin film layer, or located in a same layer as the drain electrode of the thin film transistor.

In one or more embodiment of the present disclosure, two first thin film transistors are provided, one of the two first thin film transistors is located at a side of the other one of the two first thin film transistors away from the display region; and two second thin film transistors are provided, one of the two second thin film transistors is located at a side of the other one of the two second thin film transistors away from the display region.

In one or more embodiment of the present disclosure, the first thin film transistor and the second thin film transistor are connected through the data signal transmission line.

In one or more embodiment of the present disclosure, the data signal transmission line is intersected with the first signal line and the second signal line, respectively.

In one or more embodiment of the present disclosure, the display substrate further includes a plurality of multiplexers, a first end of each of the plurality of multiplexers is electrically connected with the data signal transmission line, and a second end of the multiplexer is electrically connected with at least two signal output pads of the plurality of signal output pads.

In one or more embodiment of the present disclosure, the plurality of signal output pads include a first signal output pad and a second signal output pad, the first signal output pad and the second signal output pad are connected with two different signal lines, respectively, and the first signal output pad is closer to the display region than the second signal output pad to the display region.

In one or more embodiment of the present disclosure, an included angle between the first signal output pad and the second signal output pad is greater than 90° and is smaller than or equal to 135°.

In one or more embodiment of the present disclosure, the plurality of signal output pads include a plurality of first signal output pads and a plurality of second signal output pads; the plurality of first signal output pads are arranged alternately with the plurality of second signal output pads; the plurality of second signal output pads are closer to the plurality of test pads than the plurality of first signal output pads to the plurality of test pads; and the plurality of second signal output pads are connected with the plurality of data signal transmission lines, while the plurality of first signal output pads are not connected with the plurality of data signal transmission lines.

In one or more embodiment of the present disclosure, the plurality of multiplexers are located between the plurality of signal output pads and the plurality of electrostatic release elements.

In one or more embodiment of the present disclosure, the display substrate further includes an insulating layer, the insulating layer covers the plurality of electrostatic release elements.

In one or more embodiment of the present disclosure, the display substrate further includes a signal input element, orthographic projections of the plurality of electrostatic release elements on the base substrate are located within an orthographic projection of the signal input element on the base substrate.

In one or more embodiment of the present disclosure, the signal input element includes a plurality of first pins and a plurality of second pins, the plurality of first pins are electrically connected with the plurality of signal output pads, respectively, and the plurality of second pins are electrically connected with the plurality of signal input pads, respectively.

In one or more embodiment of the present disclosure, orthographic projections of the plurality of test pads on the base substrate are located within the orthographic projection of the signal input element on the base substrate.

In one or more embodiment of the present disclosure, a portion of the display substrate located in the periphery region is bent to a rear side of a portion of the display substrate located in the display region.

In one or more embodiment of the present disclosure, a ratio of a spaced distance between two adjacent test pads to a width of each of the plurality of test pads is 1:2.

In one or more embodiment of the present disclosure, a spaced distance between two adjacent test pads is greater than or equal to 15 μm, and a width of the test pad is greater than or equal to 30 μm.

At least one embodiment of the present disclosure further provides a display device, including the display substrate described in any of the above.

BRIEF DESCRIPTION OF THE DRAWINGS

In order to more clearly illustrate the technical solutions of the embodiments of the present disclosure, the drawings of the embodiments will be briefly described in the following; it is obvious that the described drawings below are only related to some embodiments of the present disclosure and thus are not limitative to the present disclosure.

DETAILED DESCRIPTION

In order to make objects, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

In order to improve the yield and raise the market competitiveness of the product, an array test will be performed during a manufacturing process of the product so as to effectively detect a deficiency such as Mura in the design and the manufacturing process of the display substrate, thereby achieving the objective of early detection and early resolution of the problem(s).

Figure 1:
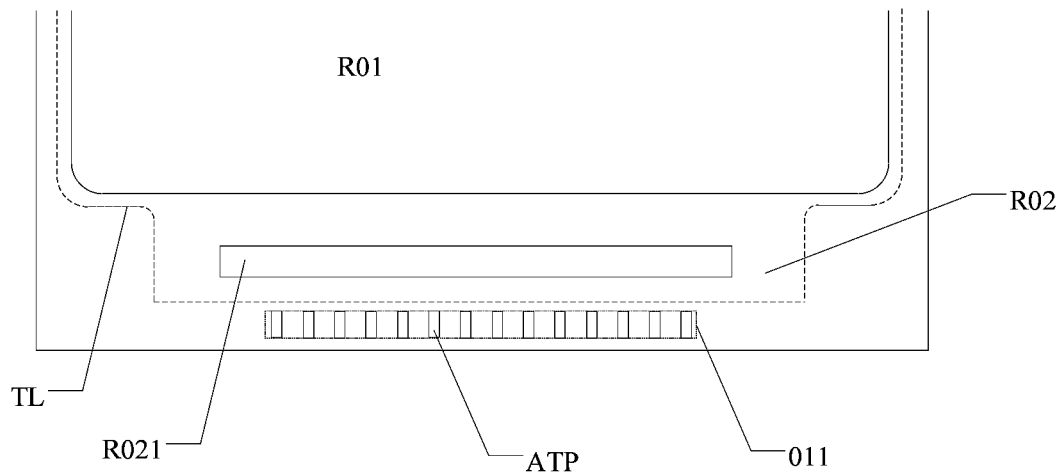
FIG. 1 is a schematic diagram illustrating a partial structure of a product having a Chip On Film (COF) structure.

FIG. 1 is a schematic diagram illustrating a partial structure of a product having a Chip on Film (COF) structure or a Chip on Flex (COF) structure. As illustrated in FIG. 1, the display device includes a display region R01 and a periphery region R02 located at a side of the display region R01. A bonding region R021 is located in the periphery region R02. A flexible circuit board is bonded in the bonding region R012. FIG. 1 illustrates an outline TL of a display substrate, and an array test unit 011 is located outside the outline TL. The array test unit 011 includes a plurality of array test pads ATPs. For example, after the array test is performed, a cutting process may be performed along the outline TL so that the finally obtained display device may not include the array test unit 011.

Manufactures of display devices, for example, manufactures of mobile phones usually seek for smaller and smaller lower bezels to narrow a "jaw" of the display device in every possible way, and to obtain screens with higher screen-to-body ratio for mobile phones. Therefore, products adopting the Chip on Panel (COP) structure have been favored even more by the panel industry. The design of the product having the COP structure can achieve the objectives of narrowing the lower bezel, reducing the cost and the like.

Figure 2:
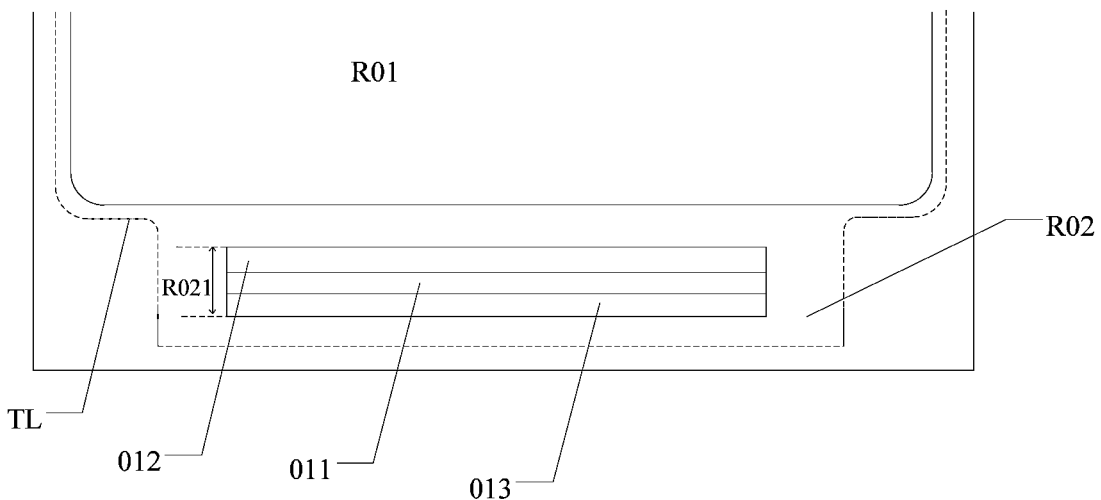
FIG. 2 is a schematic diagram illustrating a partial structure of a product having a Chip On Panel (COP) structure.

FIG. 2 is a schematic diagram illustrating a partial structure of a product having a COP structure. As illustrated in FIG. 2, the display device includes a display region R01 and a periphery region R02 located at a side of the display region R01. FIG. 2 illustrates an outline TL of a display substrate, a connection region R021 is provided in the periphery region R02, and an array test unit 011 is provided between a signal output unit 012 and a signal input unit 013. The signal output unit 012 and the signal input unit 013 are bonded with a signal input element, respectively. After a bonding process is completed, a cutting process may be performed along the outline TL, and then a portion of the base substrate located in the periphery region R02 is bent to a rear surface of a portion of the base substrate located in the display region R01 to form a display device with narrow bezel.

Figure 3:
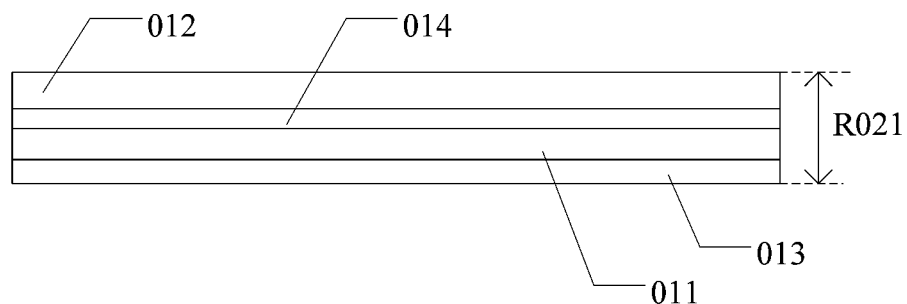
FIG. 3 is a schematic diagram of a periphery region of a display substrate.

FIG. 3 is a schematic diagram of a periphery region of a display substrate. As illustrated in FIG. 3, a multiplexer (MUX) unit (data selector unit) 014 is further provided between the array test unit 011 and the signal output unit 012 so as to facilitate reducing the number of wirings and further achieving the narrow bezel.

However, for both of the product having the COF structure illustrated in FIG. 1 and the product having the COP structure illustrated in FIG. 2, when an array test is performed, a contact between a probe of a test device and the array test unit 011 is prone to produce static electricity, and a voltage instantaneously generated in the test would be extremely high, which may damage or burn the components and elements in the display substrate and result in display deficiencies or scrapped products.

An embodiment of the present disclosure provides a display substrate, and an electrostatic release unit is added in the display substrate so as to prevent static electricity (the instantaneously generated, extremely high voltage) produced due to the contact during the array test from damaging or burning the components and elements of the display substrate.

Figure 4:
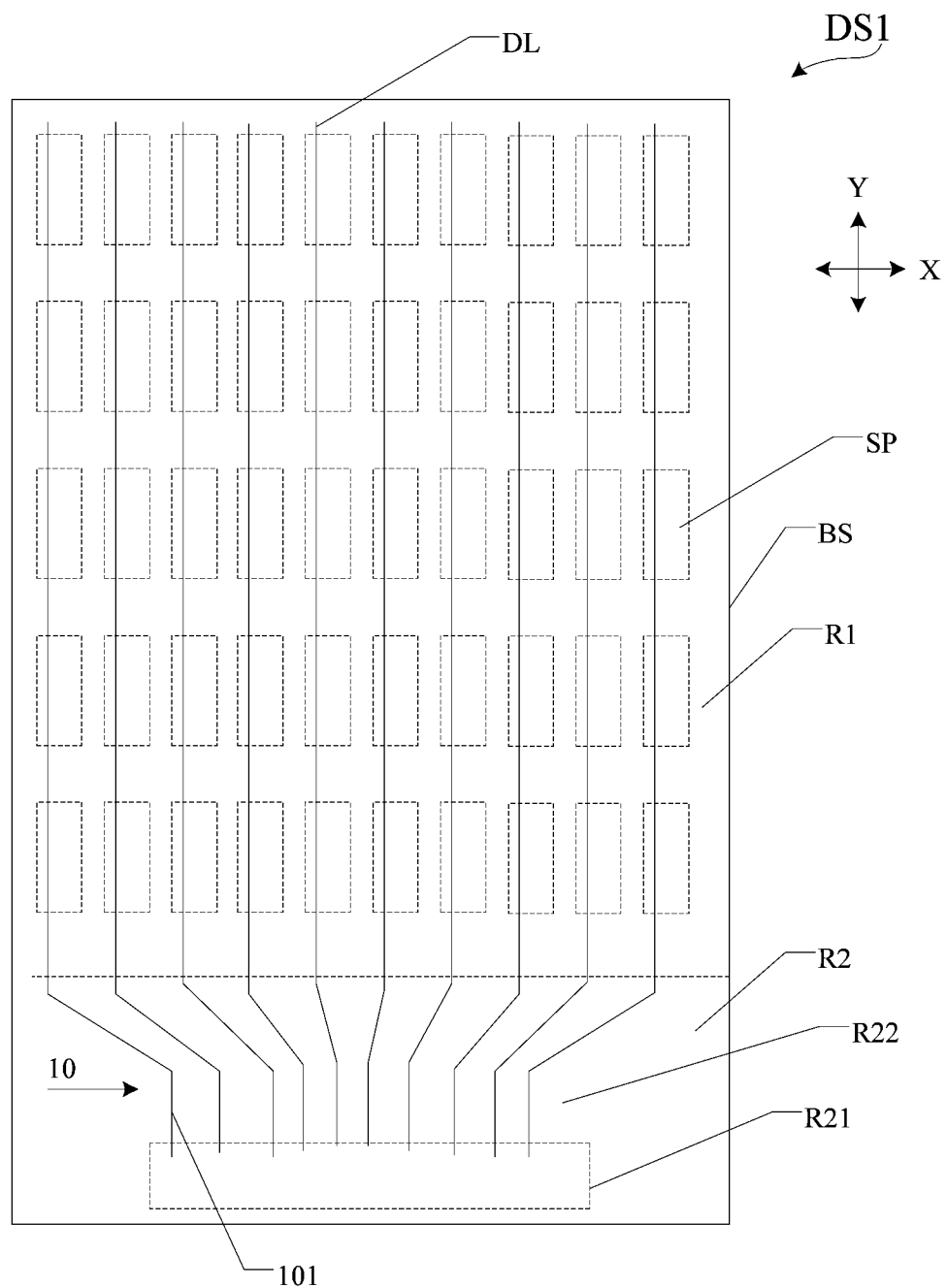
FIG. 4 is a plan view of a display substrate provided by an embodiment of the present disclosure.

FIG. 4 is a plan view of a display substrate provided by an embodiment of the present disclosure. As illustrated in FIG. 4, the display substrate DS1 includes a base substrate BS, the base substrate BS includes a display region R1 and a periphery region R2 at least located at one side of the display region R1. The base substrate BS may adopt a flexible substrate, without limited thereto. For example, the base substrate BS may adopt polyimide, without limited thereto.

As illustrated in FIG. 4, the display substrate DS1 further includes a plurality of sub-pixels SP and a plurality of data lines DL, the plurality of sub-pixels SP are electrically connected with the plurality of data lines. As illustrated in FIG. 4, the plurality of sub-pixels SP are located in the display region R1; the plurality of data lines DL are located in the display region R1, each of the plurality of data lines DL is electrically connected with part of sub-pixels SP in the plurality of sub-pixels SP. For example, as illustrated in FIG. 4, each of the plurality of data lines DL is electrically connected with one column of sub-pixels SP of the plurality of sub-pixels SP. The display substrate DS1 is illustrated in FIG. 4 with reference to the case where the plurality of sub-pixels SP are arranged in an array along a first direction X and a second direction Y, by way of example. For example, the first direction X is a row direction and the second direction Y is a column direction, without limited thereto. Of course, in other embodiments, the plurality of sub-pixels SP may also adopt an arrangement manner other than the two-dimensional array arrangement illustrated in FIG. 4. FIG. 4 schematically illustrates a plurality of data lines DL and a plurality of sub-pixels SP, and the data lines DL may not be overlapped with the sub-pixels SP.

As illustrated in FIG. 4, each of the plurality of data lines DL is connected with a bending line 101 located in the periphery region R2, and a plurality of bending lines 101 are gathered to a connection region (bonding region) R21. The connection region R21 is located in the periphery region R2. The periphery region R2 further includes a gathering region R22. The plurality of bending lines 101 constitute a gathering unit 10, and the gathering unit 10 is located in the gathering region R22. The gathering region R22 is located between the connection region R21 and the display region R1. FIG. 4 does not illustrate the specific structure in the connection region R21.

Figure 5:
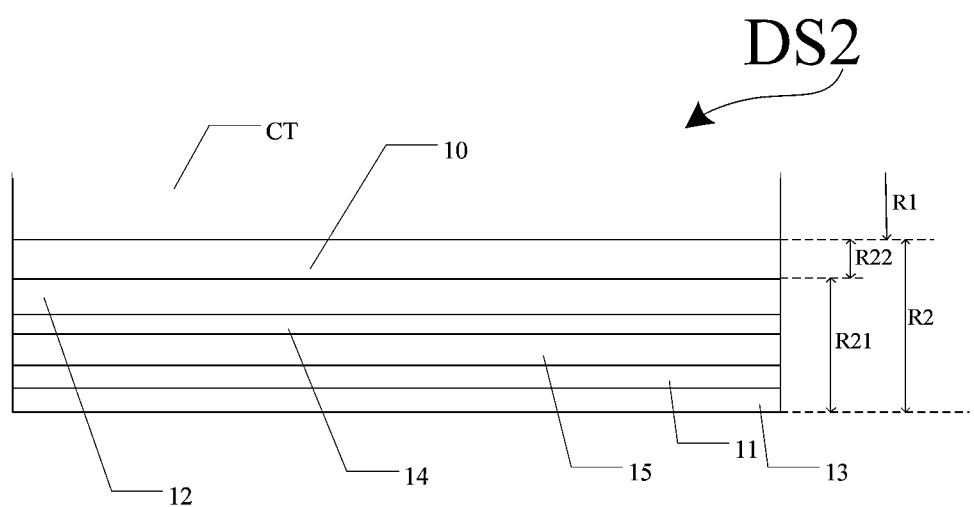
FIG. 5 is a schematic diagram of a display substrate provided by an embodiment of the present disclosure.

FIG. 5 is a schematic diagram of a display substrate provided by an embodiment of the present disclosure. As illustrated in FIG. 5, the display substrate DS2 includes a cell test unit CT located in the display region R1 and a gathering unit 10 located in the gathering region R22; the display substrate further includes a signal output unit 12, a multiplexer (MUX) unit (data selector unit) 14, an electrostatic release unit 15, a cell test unit 11, and a signal input unit 13 which are located in the connection region R21.

Figure 6:
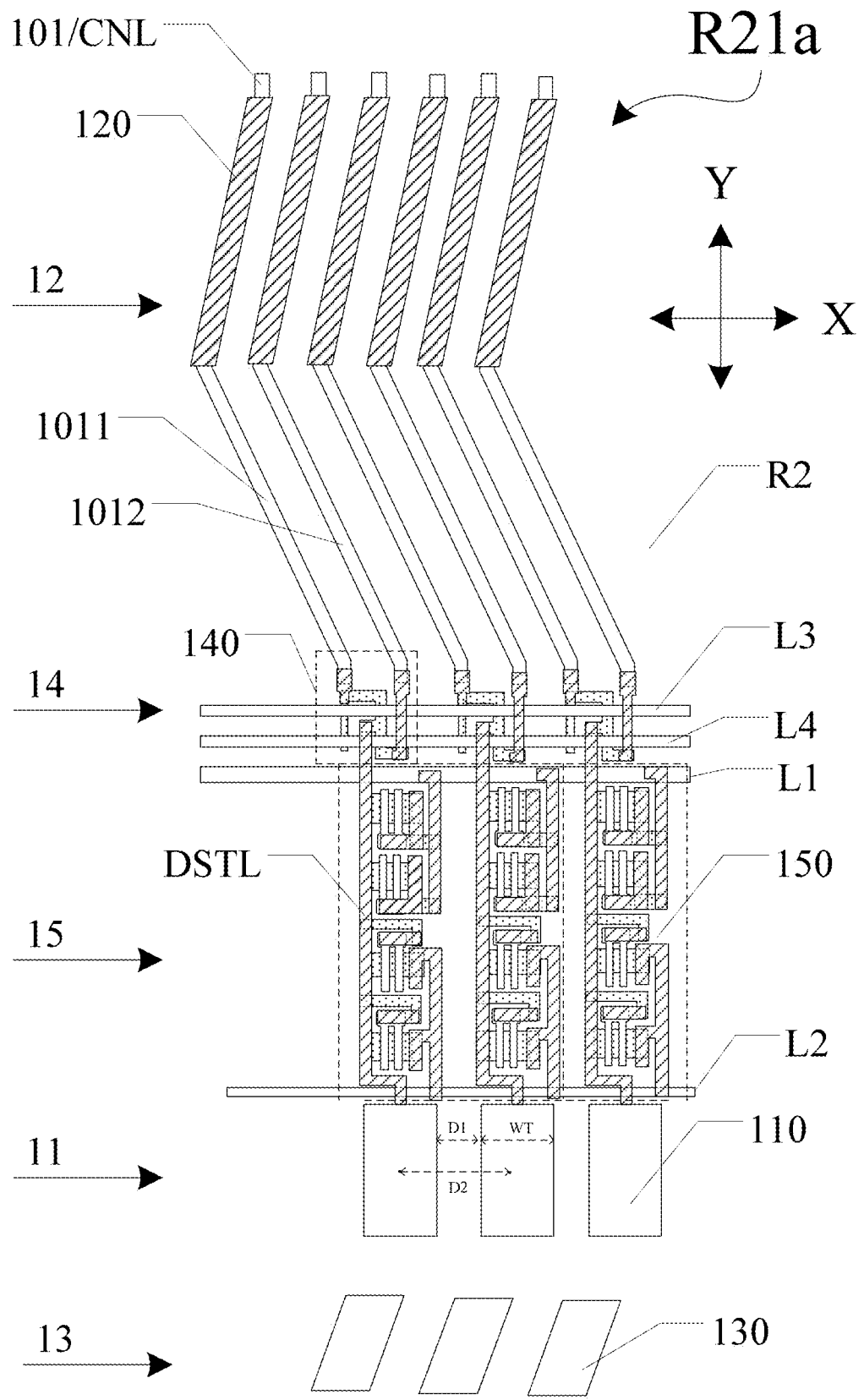
FIG. 6 is a schematic diagram of a connection region of a display substrate provided by an embodiment of the present disclosure.

FIG. 6 is a schematic diagram of a connection region of a display substrate provided by an embodiment of the present disclosure. The connection region R21a of the display substrate includes a signal output unit 12, a multiplexer (MUX) unit (data selector unit) 14, a cell test unit 11, and a signal input unit 13. An electrostatic release unit 15 is provided between the MUX unit 14 and the cell test unit 11. As illustrated in FIG. 6, the display substrate R21a includes a plurality of data signal transmission lines DSTL; the signal output unit 12 includes a plurality of signal output pads 120; the signal input unit 13 includes a plurality of signal input pads 130; the cell test unit 11 includes a plurality of test pads 110; the electrostatic release unit 15 includes a plurality of electrostatic release elements 150; the MUX unit 14 includes a plurality of multiplexers (MUXs) 140. For example, the MUXs (data selectors) 140 are located between the plurality of signal output pads 120 and the plurality of electrostatic release elements 150.

In the display substrate provided by an embodiment of the present disclosure, an electrostatic release unit 15 is added in the connection region of the periphery region, which can effectively reduce the damage to the MUX unit 14 and other circuit units caused by the static electricity produced during the array test, improve the product yield and raise the market competitiveness.

Referring to FIG. 5 and FIG. 6, the electrostatic release unit 15 is located between the signal output unit 12 and the cell test unit 11. The electrostatic release unit 15 is located between the MUX unit 14 and the cell test unit 11. The cell test unit 11 is located between the electrostatic release unit 15 and the signal input unit 13.

For example, as illustrated in FIG. 6, in order to be matched with an external test device (for example, array test device), a ratio of a spaced distance D1 between two adjacent test pads 110 to a width WT of the test pad 110 is 1:2, without limited thereto. For example, the spaced distance between two adjacent test pads 110 is greater than or equal to 15 μm, and the width WT of each of the test pads 110 is greater than or equal to 30 μm. For example, as illustrated in FIG. 6, a distance D2 between two adjacent test pads 110 is 45 μm. For example, a plurality of test pads 110 is arranged along a first direction X, and a width WT of the test pad 110 is a length of the test pad 110 along an arrangement direction (the first direction X) of the plurality of test pads 110.

As illustrated in FIG. 6, a plurality of data signal transmission lines DSTL is located in the periphery region R2, each of the data signal transmission lines DSTL is electrically connected with at least one data line DL of the plurality of data lines DL. Referring to FIG. 6 and FIG. 4, each of the signal output pads 120 is connected with one bending line 101, and hence is connected with one data line DL. FIG. 6 illustrates the case where each of the data signal transmission lines DSTL is electrically connected with two data lines DL by way of example. In other embodiments, each of the data signal transmission lines DSTL may also be electrically connected with more than two data lines DL.

As illustrated in FIG. 6, a plurality of signal output pads 120 is located in the periphery region R2. Referring to FIG. 6 and FIG. 4, the plurality of signal output pads 120 are located between the plurality of data lines DL and the plurality of data signal transmission lines DSTL, and the plurality of signal output pads 120 are electrically connected with the plurality of data lines DL, respectively. For example, each of the signal output pads 120 is connected with one bending line 101, and hence is electrically connected with the data line DL. As illustrated in FIG. 6, each of the data signal transmission lines DSTL is electrically connected with at least two signal output pads 120. FIG. 6 illustrates a display substrate in which one signal output pad 120 is connected with one bending line 101 and hence is connected with one data line DL, and two signal output pads 120 are connected with one data signal transmission line DSTL, by way of example. As illustrated in FIG. 6, one data signal transmission line DSTL is connected with two signal output pads 120 through one MUX (multiplexer) 140, and hence is connected with two data lines DL. For example, a first end of the MUX (data selector) 140 is electrically connected with one data signal transmission line DSTL, and a second end of the MUX 140 is electrically connected with at least two signal output pads 120. FIG. 6 illustrates a display substrate in which the first end of the MUX 140 is electrically connected with one data signal transmission line DSTL and the second end of the MUX 140 is electrically connected with two signal output pads 120, by way of example. As illustrated in FIG. 6, the plurality of signal output pads 120 are located in the same row. For example, after a data signal arrives at the MUX 140, by controlling a third signal line L3 and a fourth signal line L4 to be turned on at different time periods, respectively, the data signal on the data signal transmission line DSTL is transmitted to one bending line 1011 or one bending line 1012 which are connected with the MUX 140, and hence is transmitted to the data line connected with the bending line 1011 or the data line connected with the bending line 1012.

As illustrated in FIG. 6, a plurality of signal input pads 130 is located in the periphery region R2. Referring to FIG. 6 and FIG. 4, the plurality of signal input pads 130 are located at a side of the signal output pads 120 away from the display region R1. The plurality of signal output pads 120 and the plurality of signal input pads 130 are configured to be bonded with a signal input element, respectively. For example, the signal input element includes an integrated circuit (IC); for example, the signal input element includes a driving IC.

As illustrated in FIG. 6, a plurality of test pads 110 is located between the plurality of signal output pads 120 and the plurality of signal input pads 130; each of the test pads 110 is connected with one data signal transmission line DSTL, and the test pad 110 is configured to be connected with an external detection device during a manufacturing process of a display substrate so as to detect the display substrate. For example, the display substrate is detected by the external detection device, e.g., an array test device, so as to determine whether the display substrate is a qualified product. The external detection device may be connected with the test pad 110 by way of pinning, so as to detect whether the display substrate is a qualified product. For example, a measuring resistor may be utilized to determine whether the display substrate is disconnected or whether the display substrate is shorted; for example, it's possible to measure whether the data line DL is disconnected, whether adjacent data lines DL are shorted, or other information.

As illustrated in FIG. 6, a plurality of electrostatic release elements 150 is located between the plurality of signal output pads 120 and the plurality of test pads 110; the electrostatic release elements 150 are connected with the data signal transmission lines DSTL, and each of the electrostatic release elements 150 is configured to release the static electricity on the data signal transmission line DSTL connected thereto. The electrostatic release element 150 is configured to release the static electricity on the data signal transmission line DSTL connected thereto during the test (e.g., array test) of the display substrate.

Figure 7A:
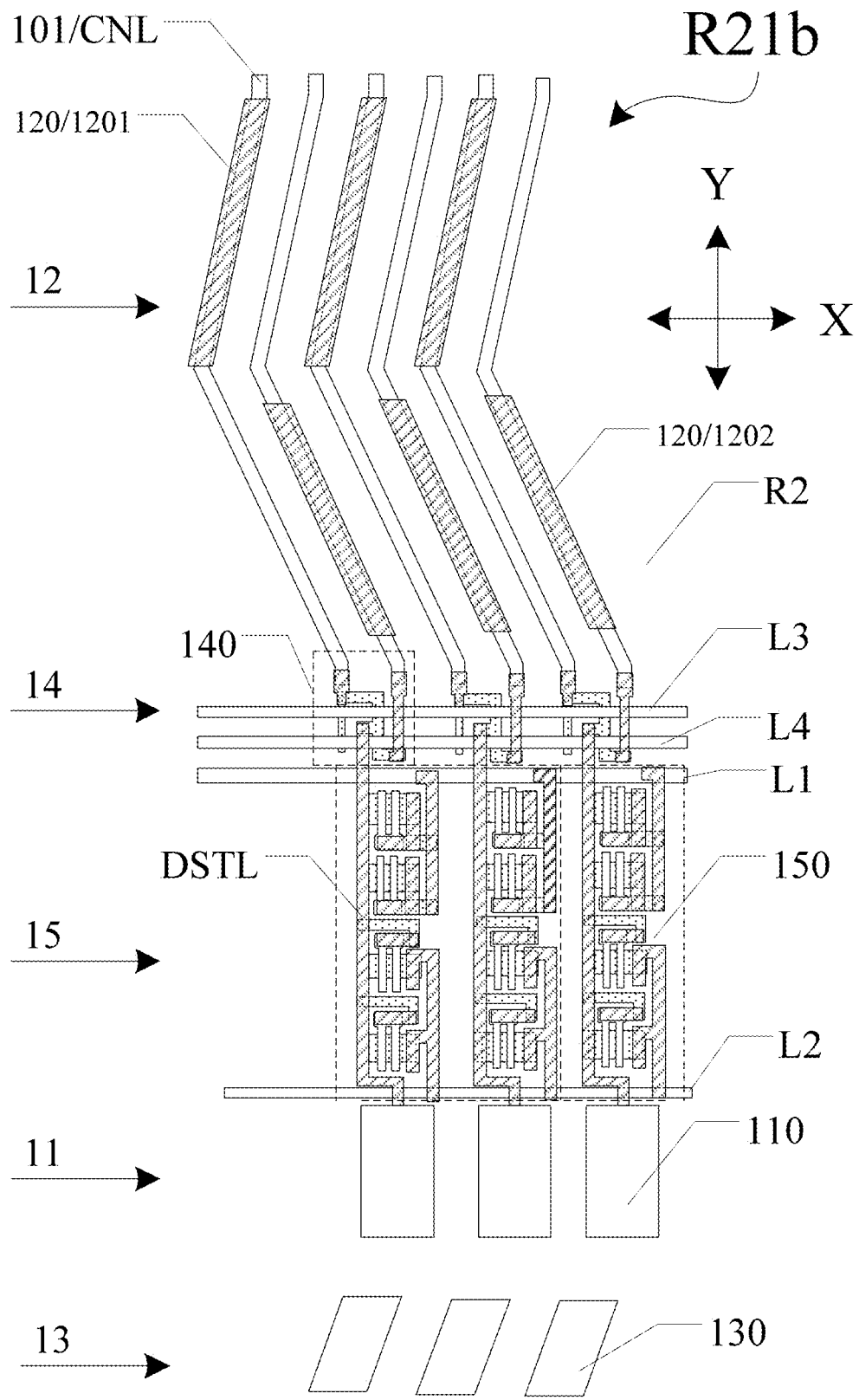
FIG. 7A is a schematic diagram of a connection region of a display substrate provided by an embodiment of the present disclosure.

FIG. 7A is a schematic diagram of a connection region of a display substrate provided by an embodiment of the present disclosure. As compared to the connection region R21a of the display substrate, in the connection region R21b of the display substrate, a plurality of signal output pads 120 is formed as a dual-row structure. As illustrated in FIG. 7A, the plurality of signal output pads 120 include a first signal output pad 1201 and a second signal output pad 1202. Referring to FIG. 7A and FIG. 4, the first signal output pad 1201 and the second signal output pad 1202 are connected with two different bending lines 101, respectively, and hence are connected with two different signal lines DL, respectively; the first signal output pad 1201 is closer to the display region R1 than the second signal output pad 1202 to the display region R1. As illustrated in FIG. 7A, the second signal output pad 1202 is closer to the plurality of test pads 110 than the first signal output pad 1201 to the plurality of test pads 110. In order for clarity of illustration, FIG. 7A does not illustrate the via hole for connecting elements in different layers.

For example, as illustrated in FIG. 7A, an included angle between the first signal output pad 1201 and the second signal output pad 1202 is greater than 90°. Further, for example, in order to better utilize the space and facilitate the bonding process, the included angle between the first signal output pad 1201 and the second signal output pad 1202 is greater than 90° and smaller than or equal to 135°.

Figure 7B:
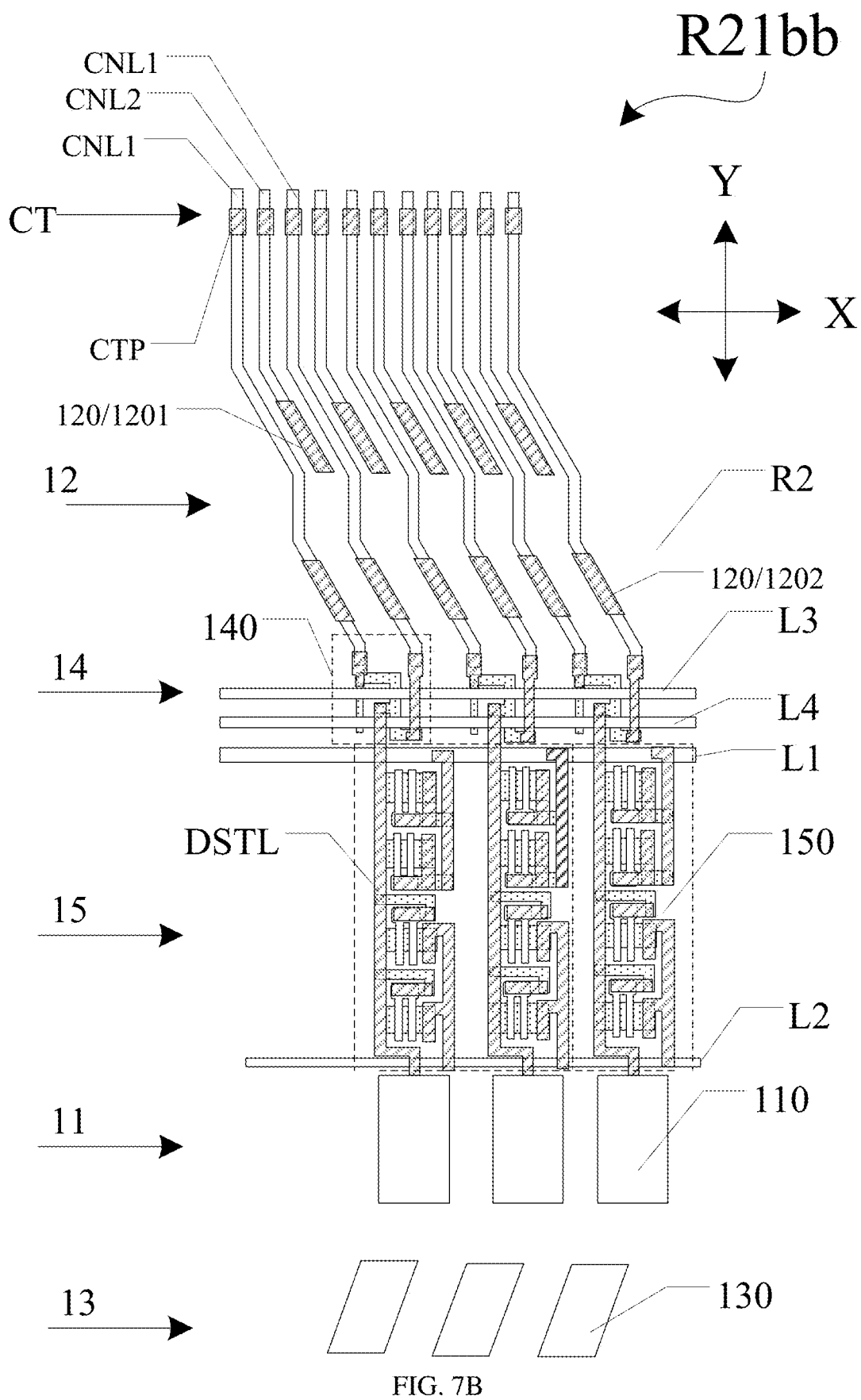
FIG. 7B is a schematic diagram of a connection region of a display substrate provided by an embodiment of the present disclosure.

FIG. 7B is a schematic diagram of a connection region of a display substrate provided by an embodiment of the present disclosure. As illustrated in FIG. 7B, the plurality of signal output pads 120 include a plurality of first signal output pads 1201 and a plurality of second signal output pads 1202. Referring to FIG. 7B and FIG. 4, the plurality of first signal output pads 1201 are closer to the display region R1 than the plurality of second signal output pads 1202 to the display region R1. Between adjacent first signal output pads 1201, there is one second signal output pad 1202 provided; and between adjacent second signal output pads 1202, there is one first signal output pad 1201 provided.

As illustrated in FIG. 7B, the plurality of first signal output pads 1201 are arranged alternately with the plurality of second signal output pads 1202; the plurality of second signal output pads 1202 are closer to the plurality of test pads 110 than the plurality of first signal output pads 1201 to the plurality of test pads 110; the plurality of second signal output pads 1202 are connected with the plurality of data signal transmission lines DSTL; the plurality of first signal output pads 1201 are not connected with the plurality of data signal transmission lines DSTL. By using an external detection device such as an array test device, odd-numbered rows of data lines DL or even-numbered rows of data lines DL on the display substrate are detected to determine whether the display substrate is a qualified product.

As illustrated in FIG. 7A and FIG. 6, it's also possible that the signal output pad 120 is not directly connected with the bending line 101 but is connected with a connecting line CNL, and the connecting line CNL may be connected with the plurality of data lines DL in the display region through other structure(s). For example, the connecting line CNL may be connected with the plurality of data lines DL in the display region through the MUX unit.

As illustrated in FIG. 7A and FIG. 6, the signal output pad 120 may be connected with the bending line (or the connecting line CNL) through a via hole, without limited thereto.

As illustrated in FIG. 7B, one end of the MUX 140 is connected with the data signal transmission line DSTL, and the other end of the MUX 140 is connected with two first connecting lines CNL1, respectively; between the two first connecting lines CNL1, there is a second connecting line CNL2 provided; the first connecting line CNL1 is connected with the second signal output pad 1202, and the second connecting line CNL2 is connected with the first signal output pad 1201. Each of the first connecting lines CNL1 may be connected with one bending line 101 (as illustrated in FIG. 4), and hence be connected with one data line DL (as illustrated in FIG. 4); each of the second connecting lines CNL2 may be connected with one bending line 101 (as illustrated in FIG. 4), and hence be connected with one data line DL (as illustrated in FIG. 4). In the embodiment illustrated in FIG. 4, the array test is only performed to data lines of odd-numbered columns or even-numbered columns in the display region R1. Of course, in other embodiments, the MUX 140 may also be connected with more first connecting lines CNL1.

As illustrated in FIG. 7B, a cell test unit CT is disposed at a side of the signal output unit 12 away from the cell test unit 11; the cell test unit CT includes a plurality of test pads CTP. A part of the plurality of test pads CTP are connected with a plurality of first connecting lines CNL1, respectively; and the other part of the plurality of test pads CTP are connected with a plurality of second connecting lines CNL2, respectively. For example, each of the first connecting lines CNL1 is connected with one test pad CTP; each of the second connecting lines CNL2 is connected with one test pad CTP.

Referring to FIG. 7B and FIG. 4, each of the first signal output pads 1201 is connected with at least one data line DL. Each of the second signal output pads 1202 is connected with at least one data line DL.

Figure 8:
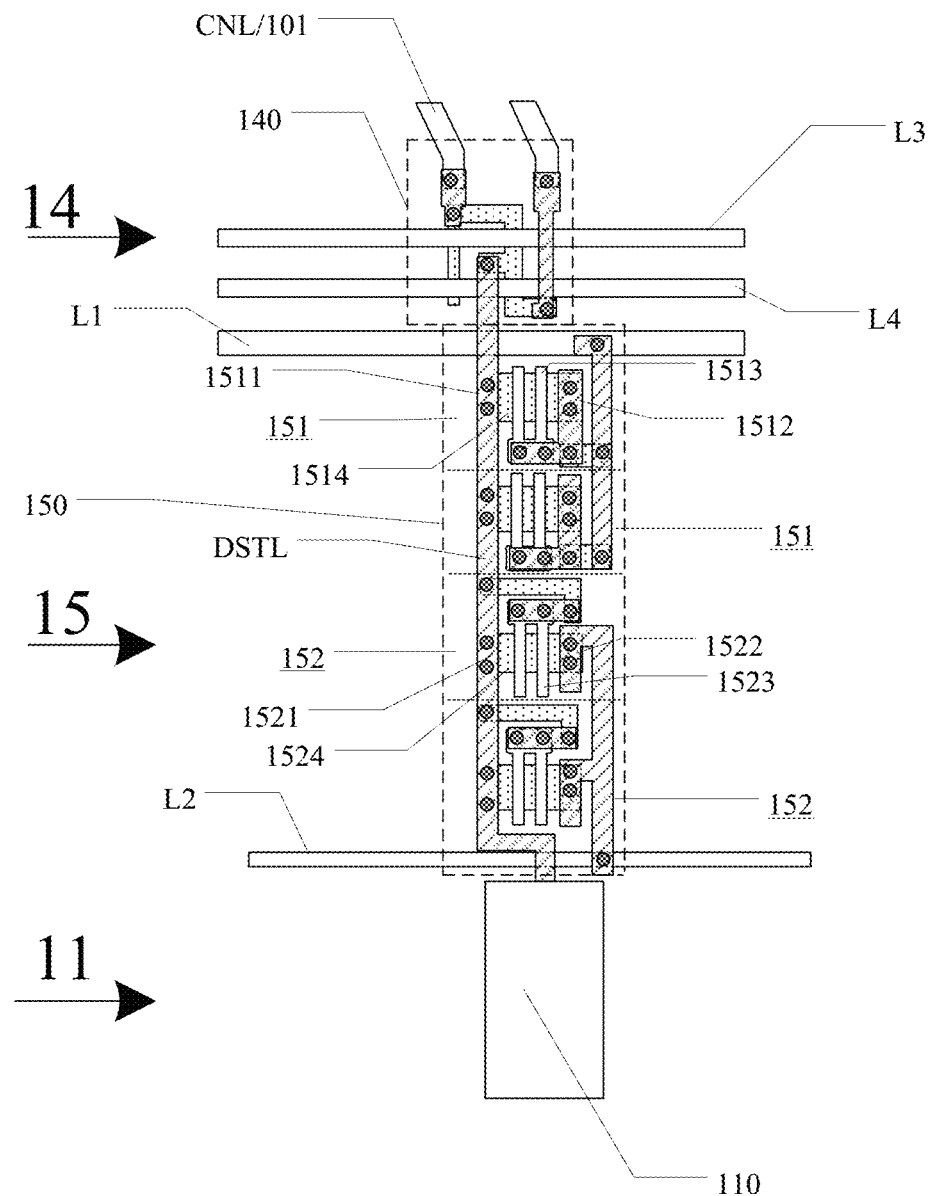
FIG. 8 is a schematic diagram of part of a periphery region of a display substrate provided by an embodiment of the present disclosure.

FIG. 8 is a schematic diagram of part of a periphery region of a display substrate provided by an embodiment of the present disclosure. FIG. 8 merely illustrates one electrostatic release element 150 and one MUX 140. As illustrated in FIG. 8, the electrostatic release element 150 includes a first thin film transistor 151, a second thin film transistor 152, a first signal line L1, and a second signal line L2; the first thin film transistor 151 is connected with the data signal transmission line DSTL and the first signal line L1, respectively; the second thin film transistor 152 is connected with the data signal transmission line DSTL and the second signal line L2, respectively.

For example, as illustrated in FIG. 8, the first thin film transistor 151 includes a first electrode 1511 and a second electrode 1512; one of the first electrode 1511 and the second electrode 1512 is connected with the data signal transmission line DSTL, and the other one of the first electrode 1511 and the second electrode 1512 is connected with the first signal line L1; the second thin film transistor 152 includes a third electrode 1521 and a fourth electrode 1522; one of the third electrode 1521 and the fourth electrode 1522 is connected with the data signal transmission line DSTL, and the other one of the third electrode 1521 and the fourth electrode 1522 is connected with the second signal line L2.

For example, as illustrated in FIG. 8, the first thin film transistor 151 further includes a first gate electrode 1513; one of the first electrode 1511 and the second electrode 1512 is connected with the first gate electrode 1513 in a short circuit to constitute a diode structure. The second thin film transistor 152 further includes a second gate electrode 1523; one of the third electrode 1521 and the fourth electrode 1522 is connected with the second gate electrode 1523 in a short circuit to constitute a diode structure. The diode has the property of being unidirectionally turned-on. FIG. 8 illustrates a display substrate in which the second electrode 1512 is connected with the first gate electrode 1513 in a short circuit, and the fourth electrode 1522 is connected with the second gate electrode 1523 in a short circuit, by way of example.

For example, as illustrated in FIG. 8, the first thin film transistor 151 further includes a first semiconductor layer 1514; the first electrode 1511 and the second electrode 1512 are electrically connected with the first semiconductor layer 1514, respectively. The second thin film transistor 152 further includes a second semiconductor layer 1524; the third electrode 1521 and the fourth electrode 1522 are electrically connected with the second semiconductor layer 1524, respectively. For example, in order to release the static electricity in a better way, a width-to-length ratio of a channel of the first semiconductor layer 1514 is in a range of 0.2-0.5, and a width-to-length ratio of a channel of the second semiconductor layer 1524 is in a range of 0.2-0.5. FIG. 8 illustrates a plurality of via holes that is used to connect elements located in different layers together.

For example, a channel of the first thin film transistor 151 has a width of about 12 µm, and has a length of about 25 µm-50 µm, without limited thereto. For example, a channel of the second thin film transistor 152 has a width of about 12 µm, and has a length of about 25 µm-50 µm, without limited thereto.

For example, as illustrated in FIG. 8, the first thin film transistor 151 and the second thin film transistor 152 are connected with each other through the data signal transmission line DSTL.

For example, as illustrated in FIG. 8, the data signal transmission line DSTL is intersected with the first signal line L1 and the second signal line L2, respectively.

For example, as illustrated in FIG. 8, there are two first thin film transistors provided, in which one first film transistor is located at a side of the other first film transistor away from the display region; there are two second thin film transistors provided, in which one second film transistor is located at a side of the other second film transistor away from the display region.

For example, as illustrated in FIG. 8, in order to improve the capacity of the electrostatic release element 150 to release the static electricity, the two first thin film transistors 151 are connected in a parallel circuit to constitute a two-stage protection; the two second thin film transistors 152 are connected in a parallel circuit to constitute a two-stage protection.

For example, as illustrated in FIG. 6, FIG. 7A, FIG. 7B and FIG. 8, the MUX unit 14 includes a third signal line L3 and a fourth signal line L4. The third signal line L3 and the fourth signal line L4 may be input with signals respectively so that connecting lines CNL connected with the MUXs can be selected and turned on at different times.

For example, referring to FIG. 6 and FIG. 7A, when an array test is performed, an external test device (e.g., an array test device) is in contact with the test pad 110 by way of pinning, so as to perform the array test; a signal passing through the test pad 110 is conducted to the MUX 140 connected with a data signal transmission line DSTL through the data signal transmission line DSTL, and hence is transmitted, at different time periods, to different connecting lines CNL connected with the MUX 140, respectively, and to data lines connected with the connecting lines CNL.

When no static electricity is produced, the array test is normally performed; when static electricity is produced, a test signal is normally input into the data line, and at the same time the static electricity is released through the electrostatic release element 150 so as to prevent from affecting the components and elements on the display substrate.

Hereinafter, a formation of a structure of each of the layers illustrated in FIG. 8 will be described with reference to FIGS. 9A-9E, in order to explain a constitution of each of the film layers and a connection relationship between the film layers.

Figure 9A:
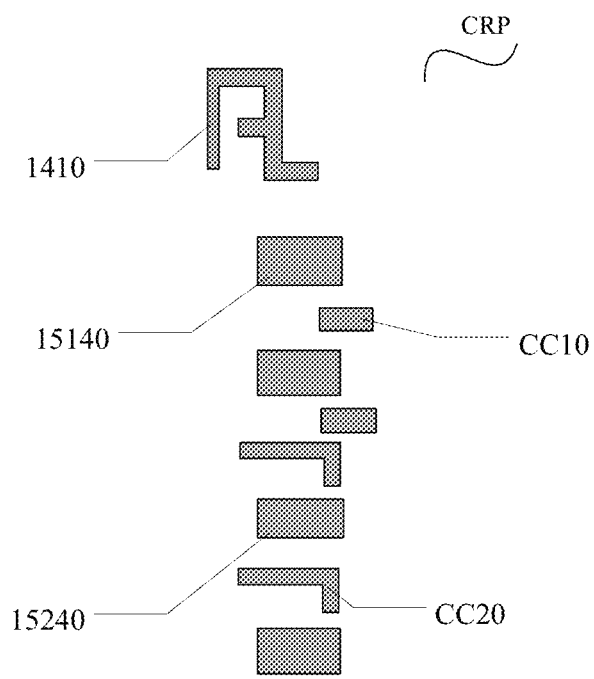
FIG. 9A is a schematic diagram of a semiconductor pattern as formed according to an embodiment of the present disclosure.

FIG. 9A is a schematic diagram of a semiconductor pattern as formed according to an embodiment of the present disclosure. As illustrated in FIG. 9A, the semiconductor pattern CRP includes a first semiconductor pattern 15140, a second semiconductor pattern 15240, a third semiconductor pattern CC10, a fourth semiconductor pattern CC20, and a fifth semiconductor pattern 1410. The first semiconductor pattern 15140, the second semiconductor pattern 15240, the third semiconductor pattern CC10, the fourth semiconductor pattern CC20, and the fifth semiconductor pattern 1410 are spaced apart from each other.

Figure 9B:
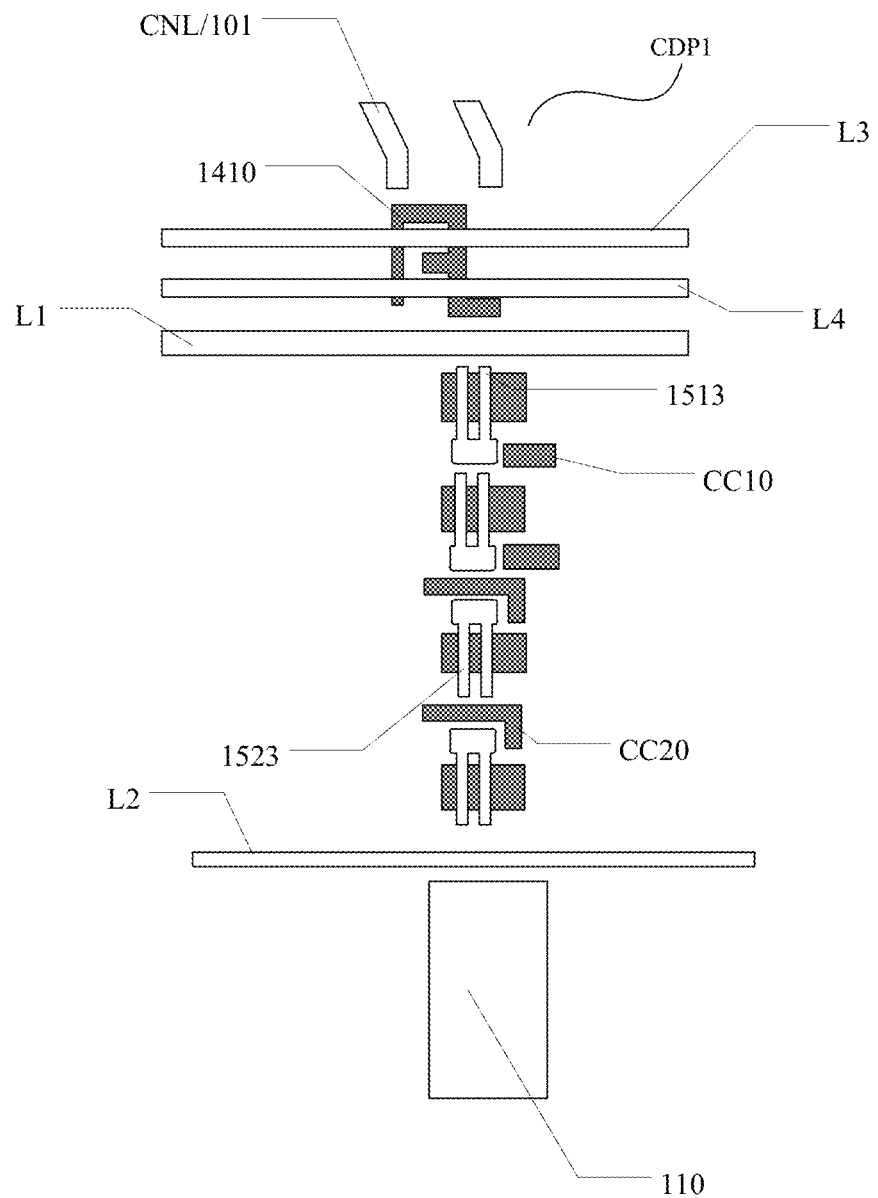
FIG. 9B is a schematic diagram illustrating a formation of a first conductive pattern on a semiconductor pattern according to an embodiment of the present disclosure.

FIG. 9B is a schematic diagram illustrating a formation of a first conductive pattern on a semiconductor pattern according to an embodiment of the present disclosure. The first conductive pattern CDP1 includes a first gate electrode 1513, a second gate electrode 1523, a test pad 110, a first signal line L1, a second signal line L2, a third signal line L3, a fourth signal line L4, and a bending line 101. The first gate electrode 1513, the second gate electrode 1523, the test pad 110, the first signal line L1, the second signal line L2, the third signal line L3, the fourth signal line L4 and the bending line 101 are spaced apart from each other.

Figure 9C:
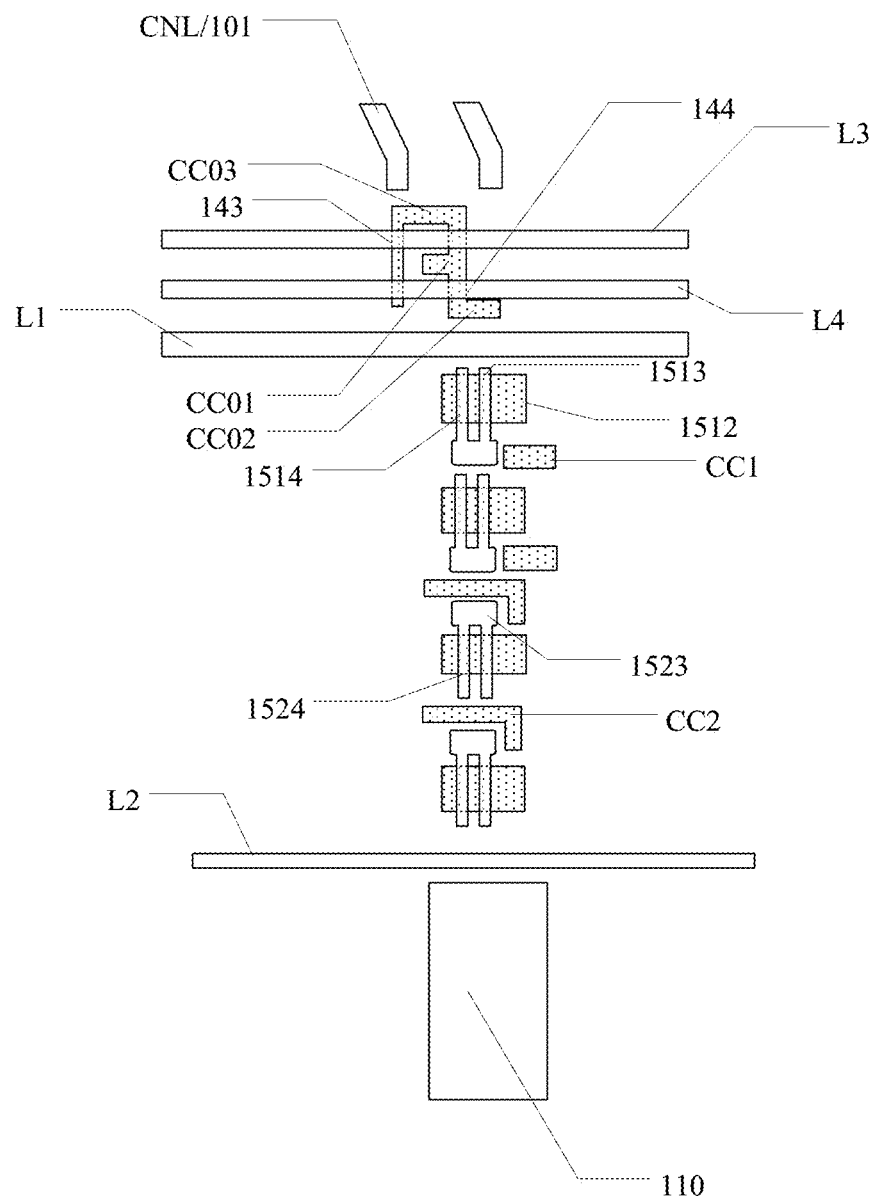
FIG. 9C is a schematic diagram illustrating a converting-into-conductor treatment performed on a semiconductor pattern by using a first conductive pattern as a mask according to an embodiment of the present disclosure.

FIG. 9C is a schematic diagram illustrating a converting-into-conductor treatment performed on a semiconductor pattern by using a first conductive pattern as a mask according to an embodiment of the present disclosure. A converting-into-conductor treatment is performed on the semiconductor pattern CPR by using the first conductive pattern CDP1 as a mask, and the converting-into-conductor treatment includes converting a portion of the semiconductor pattern CPR not covered by the mask into a conductor by, for example, a doping process. After the converting-into-conductor treatment, a portion of the semiconductor pattern CPR covered by the first conductive pattern CDP1 remains the property of a semiconductor, while the portion of the semiconductor pattern CPR not covered by the first conductive pattern CDP1 is converted into a conductor.

For example, referring to FIGS. 9A-9C, a portion of the first semiconductor pattern 15140 shielded by the first gate electrode 1513 is formed into a first semiconductor layer 1514, and the remaining portion of the first semiconductor pattern 15140 is converted into a conductor. A portion of the second semiconductor pattern 15240 shielded by the second gate electrode 1523 is formed into a second semiconductor layer 1524, and the remaining portion of the second semiconductor pattern 15240 is converted into a conductor. The third semiconductor pattern CC10 is converted into a conductor and forms into a first connecting part CC1, the fourth semiconductor pattern CC20 is converted into a conductor and forms into a second connecting part CC2. A portion of the fifth semiconductor pattern 1410 shielded by the third signal line L3 is formed into a third semiconductor layer 143; a portion of the fifth semiconductor pattern 1410 shielded by the fourth signal line L4 is formed into a fourth semiconductor layer 144. A portion of the fifth semiconductor pattern 1410 located between the third signal line L3 and the fourth signal line L4 is converted into a conductor and forms into a connecting part CC01; a portion of the fifth semiconductor pattern 1410 away from the third signal line L3 is converted into a conductor and forms into a connecting part CC02; a portion of the fifth semiconductor pattern 1410 away from the fourth signal line L4 is converted into a conductor and forms into a connecting part CC03.

Figure 9D:
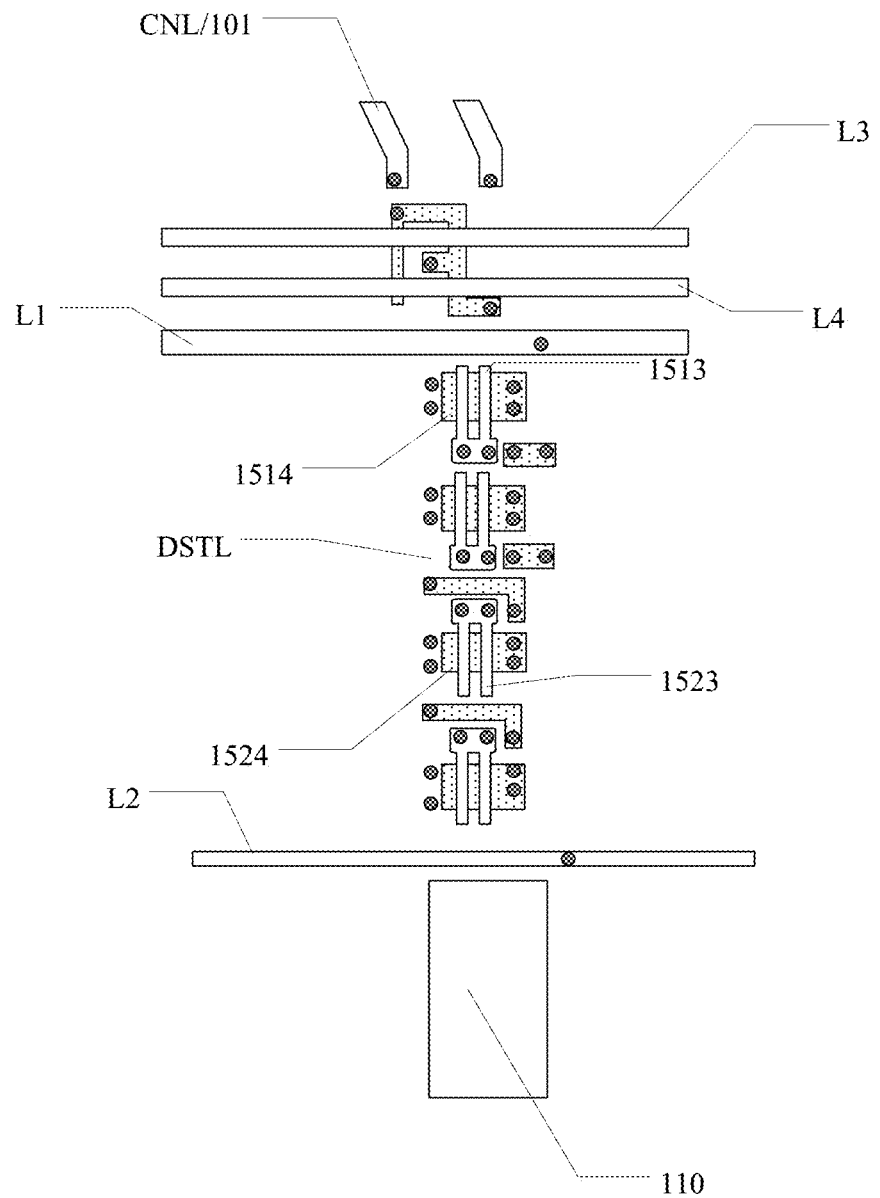
FIG. 9D is a schematic diagram illustrating a formation of a via hole in an insulating film according to an embodiment of the present disclosure.

FIG. 9D is a schematic diagram illustrating a formation of a via hole in an insulating film according to an embodiment of the present disclosure. After a treatment is performed to convert a part of the semiconductor pattern into a conductor, an insulating film is formed, and a via hole is formed in the insulating film. The via hole as formed is illustrated in FIG. 9. For clarity of illustration, the insulating film is not shown in FIG. 9D. For example, the insulating film here may include a second gate insulating layer 26 and an interlayer insulating layer 27 (referring to FIG. 12) which may be mentioned later.

Figure 9E:
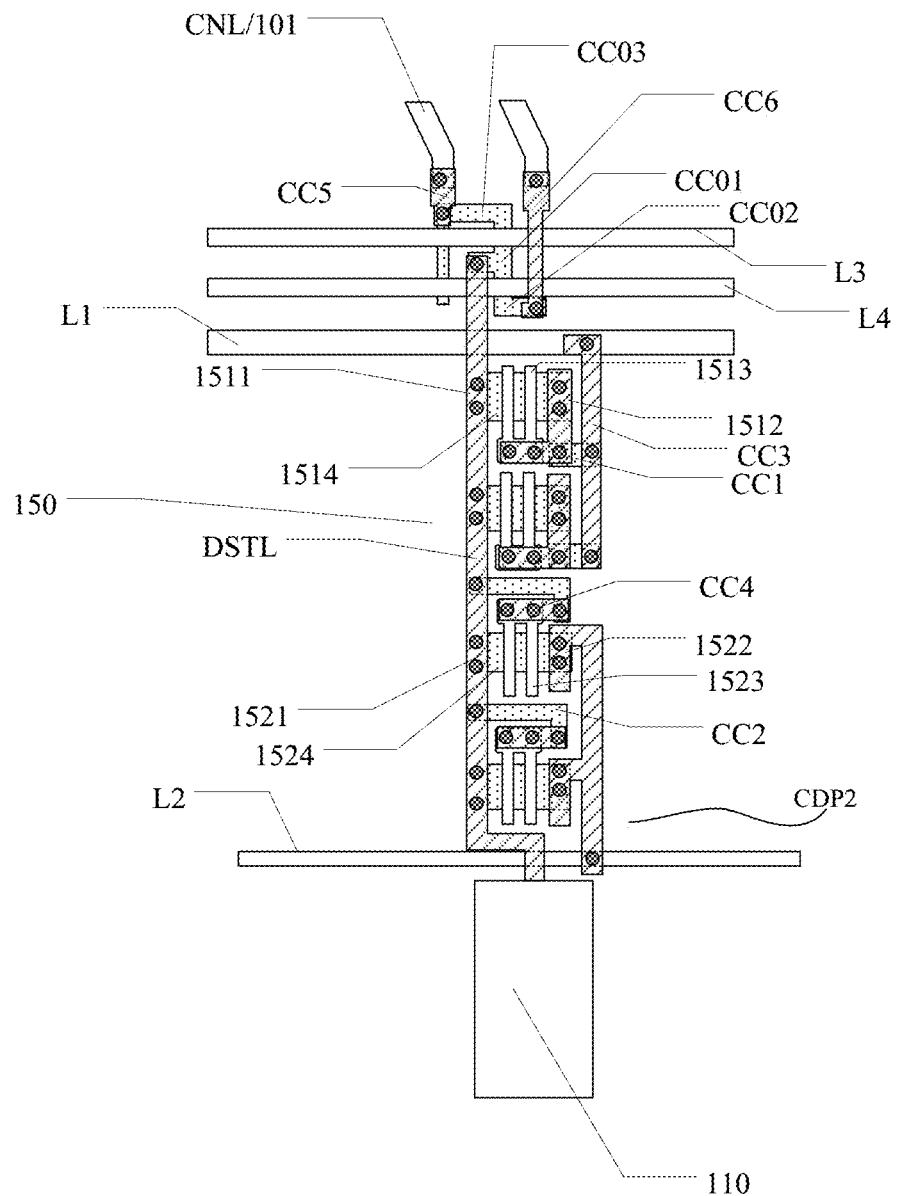
FIG. 9E is a schematic diagram illustrating a formation of a second conductive pattern after the formation of the via hole in the insulating film according to an embodiment of the present disclosure.

FIG. 9E is a schematic diagram illustrating a formation of a second conductive pattern after the formation of the via hole in the insulating film according to an embodiment of the present disclosure. As illustrated in FIG. 9E, the second conductive pattern CDP2 includes a data signal transmission line DSTL, a third connecting part CC3, a fourth connecting part CC4, a fifth connecting part CC5, a sixth connecting part CC6, a first electrode 1511, a second electrode 1512, a third electrode 1521, and a fourth electrode 1522.

For example, the data signal transmission line DSTL, the first electrode 1511, and the third electrode 1522 are formed integrally.

For example, as illustrated in FIG. 9E, the first gate electrode 1513 and the second electrode 1512 are connected through a via hole; the second electrode 1512 and the first connecting part CC1 are connected through a via hole; the first connecting part CC1 and the third connecting part CC3 are connected through a via hole; the third connecting part CC3 is connected with the first signal line L1.

For example, as illustrated in FIG. 9E, the second gate electrode 1523 is connected with the fourth connecting part CC4 through a via hole; the fourth connecting part CC4 is connected with the second connecting part CC2 through a via hole; the second connecting part CC2 is connected with the third electrode 1521 through a via hole.

For example, as illustrated in FIG. 9E, the data signal transmission line DSTL is connected with the connecting part CC0 through a via hole; the fifth connecting part CC5 is connected with the connecting part CC03 through a via hole; the fifth connecting part CC5 is connected with one bending line 101 through a via hole. The sixth connecting part CC6 is connected with the connecting part CC02 through a via hole; the sixth connecting part CC6 is connected with the other bending line 101 through a via hole.

For example, as illustrated in FIG. 9E, the first electrode 1511 and the second electrode 1512 are located at two sides of the first semiconductor layer 1514, respectively, and are connected with the first semiconductor layer 1514, respectively. For example, the first electrode 1511 is connected with a left portion of the first semiconductor pattern 15140 having been converted into a conductor; and the second electrode 1512 is connected with a right portion of the first semiconductor pattern 15140 having been converted into a conductor.

For example, as illustrated in FIG. 9E, the third electrode 1521 and the fourth electrode 1522 are located at two sides of the second semiconductor layer 1524, respectively, and are connected with the second semiconductor layer 1514, respectively. For example, the third electrode 1521 is connected with a left portion of the second semiconductor pattern 15240 having been converted into a conductor; and the fourth electrode 1522 is connected with a right portion of the second semiconductor pattern 15240 having been converted into a conductor.

Figure 9F:
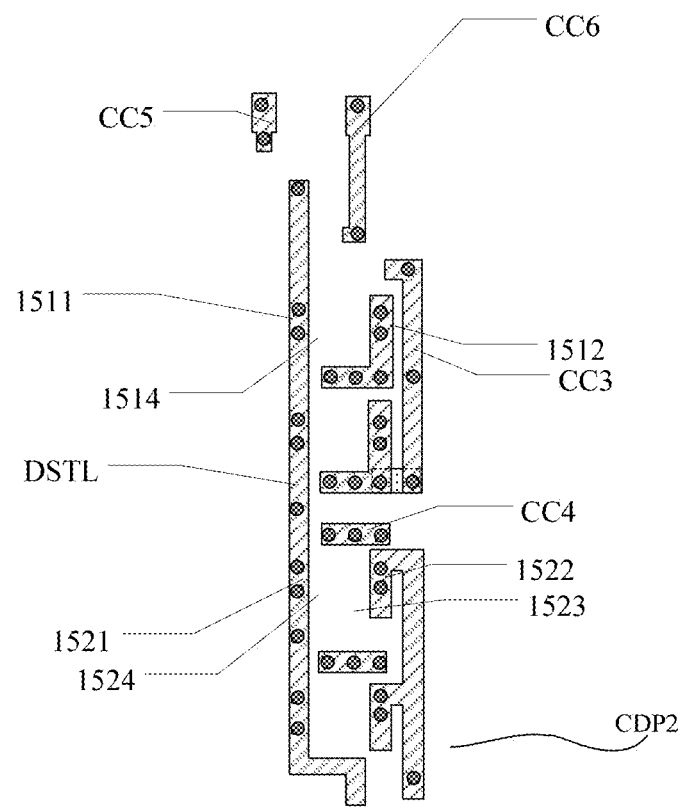
FIG. 9F is a schematic diagram of a second conductive pattern and a via hole that is in an insulating film according to an embodiment of the present disclosure.

FIG. 9F is a schematic diagram of a second conductive pattern and a via hole that is in an insulating film according to an embodiment of the present disclosure.

For example, in FIGS. 9A-9E, the bending line 101 may also be replaced by a connecting line CNL.

Figure 10A:
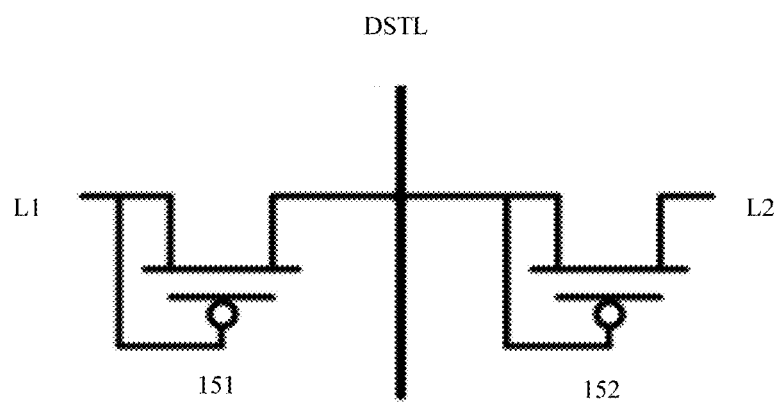
FIG. 10A is a principle diagram of an electrostatic release unit in a display substrate provided by an embodiment of the present disclosure.
Figure 10B:
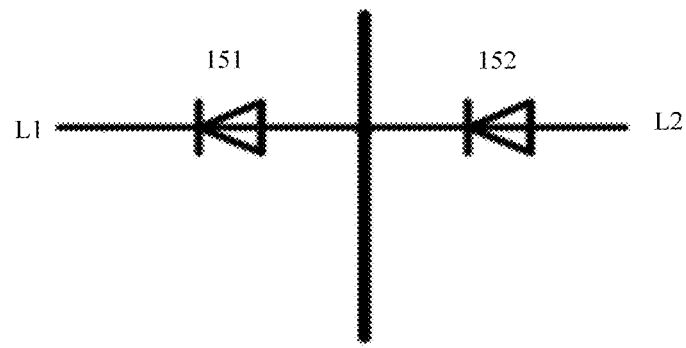
FIG. 10B is an equivalent circuit diagram of an electrostatic release unit in a display substrate provided by an embodiment of the present disclosure.
Figure 10C:
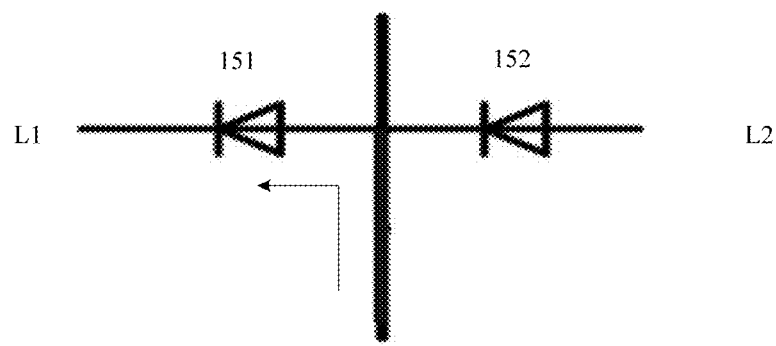
FIG. 10C is a schematic diagram illustrating an electrostatic release unit releasing a positive electrostatic charge, in a display substrate provided by an embodiment of the present disclosure.
Figure 10D:
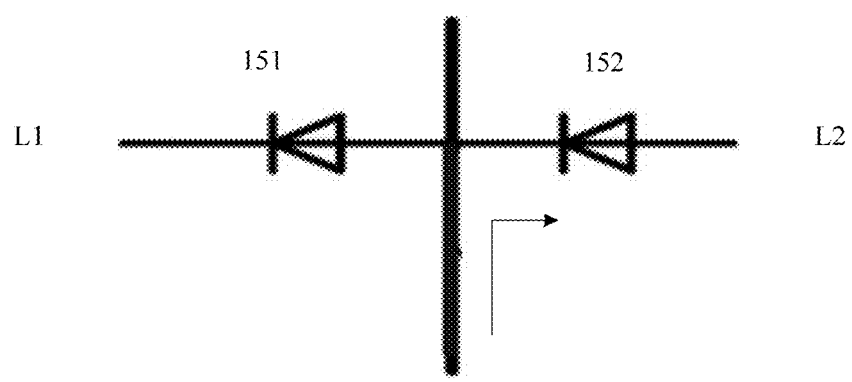
FIG. 10D is a schematic diagram illustrating an electrostatic release unit releasing a negative electrostatic charge, in a display substrate provided by an embodiment of the present disclosure.

FIG. 10A is a principle diagram of an electrostatic release unit in a display substrate provided by an embodiment of the present disclosure. FIG. 10B is an equivalent circuit diagram of an electrostatic release unit in a display substrate provided by an embodiment of the present disclosure. FIG. 10C is a schematic diagram illustrating an electrostatic release unit releasing a positive electrostatic charge in a display substrate provided by an embodiment of the present disclosure. FIG. 10D is a schematic diagram illustrating an electrostatic release unit releasing a negative electrostatic charge in a display substrate provided by an embodiment of the present disclosure.

As illustrated in FIG. 10A and FIG. 10B, the data signal transmission line DSTL is connected with the first signal line L1 through the first thin film transistor 151, and is connected with the second signal line L2 through the second thin film transistor 152.

For example, as illustrated in FIG. 10C and FIG. 10D, the first signal line L1 or the second signal line L2 is configured to release negative static electricity on the data signal transmission line DSTL, and the second signal line L2 or the first signal line L1 is configured to release positive static electricity on the data signal transmission line DSTL.

For example, the first signal line L1 may be input with a high level signal, may be a high level signal line, and may release positive static electricity on the data signal transmission line DSTL; and the second signal line L2 may be input with a low level signal, may be a low level signal line, and may release negative static electricity on the data signal transmission line DSTL. Of course, in other embodiments, it's also possible that, the first signal line L1 is a low level signal line and releases negative static electricity on the data signal transmission line DSTL, and the second signal line L2 is a high level signal line and releases positive static electricity on the data signal transmission line DSTL.

Figure 11A:
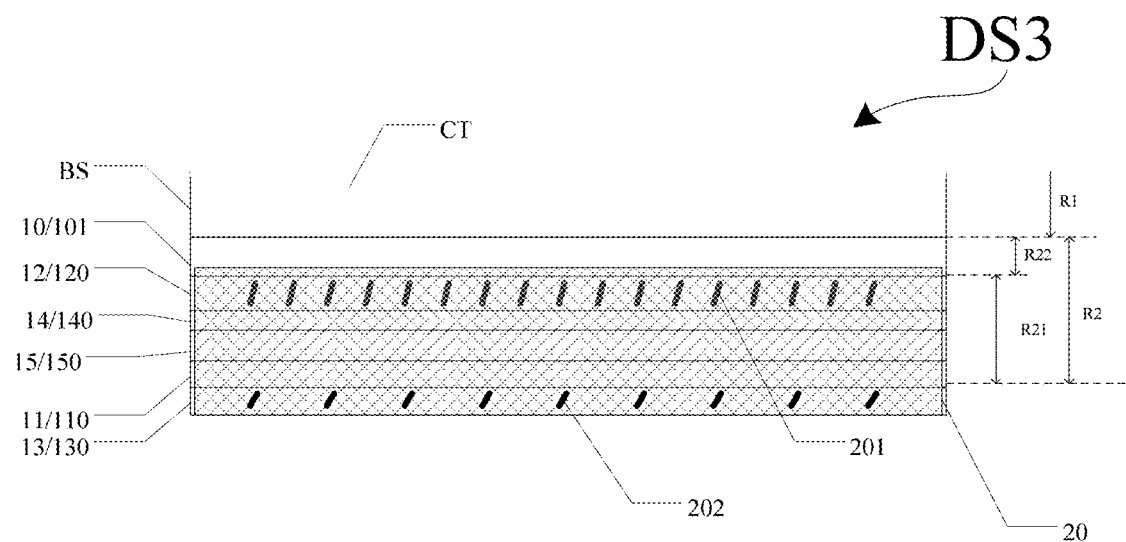
FIG. 11A is a schematic diagram illustrating a bonding position of a signal input element in a display substrate provided by an embodiment of the present disclosure.

FIG. 11A is a schematic diagram illustrating a bonding position of a signal input element in a display substrate provided by an embodiment of the present disclosure. As illustrated in FIG. 11A, the display substrate DS3 further includes a signal input element 20, and orthographic projections of a plurality of electrostatic release elements 150 on the base substrate BS are located within an orthographic projection of the signal input element 20 on the base substrate BS. For example, as illustrated in FIG. 11A, the signal input element 20 includes a first pin 201 and a second pin 202; the signal input element 20 includes one row of first pins 201 and one row of second pins 202. That is, the signal input element 20 includes first pins 201 arranged in one row and second pins 202 arranged in one row. Referring to FIG. 11A and FIG. 6, the first pin 201 and the second pin 202 are electrically connected with the signal output pad 120 in the signal output unit 12 and the signal input pad 130 in the signal input unit 13, respectively. The signal input element 20 illustrated in FIG. 11A may be bonded with the signal input unit 13 and the signal output unit 12 illustrated in FIG. 6, respectively.

Figure 11B:
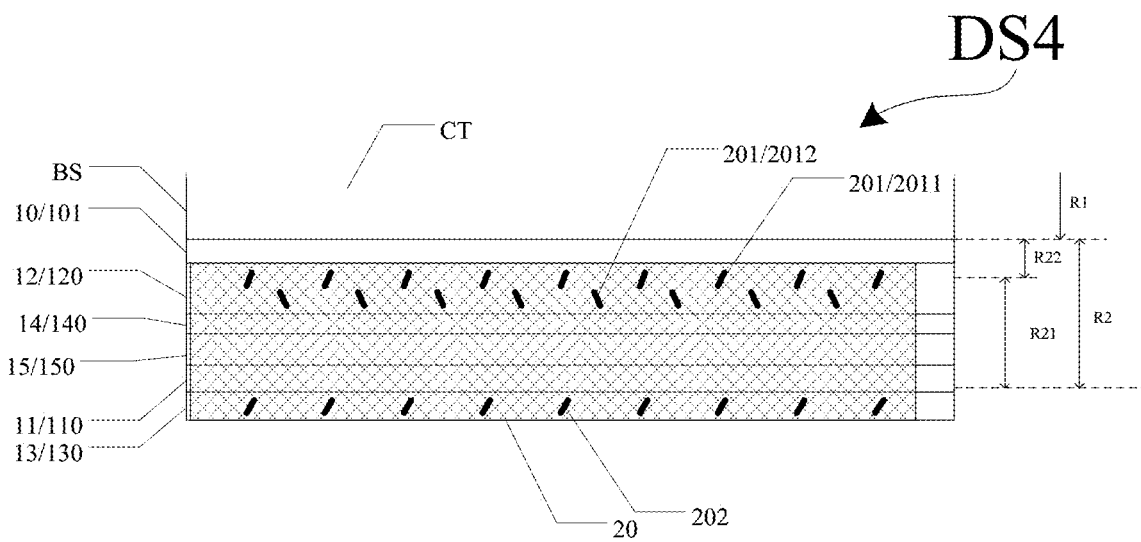
FIG. 11B is a schematic diagram illustrating a bonding position of a signal input element in a display substrate provided by an embodiment of the present disclosure.

FIG. 11B is a schematic diagram illustrating a bonding position of a signal input element in a display substrate provided by an embodiment of the present disclosure. As compared with the display substrate DS3 illustrated in FIG. 11A, in the display substrate DS4 illustrated in FIG. 11B, the first pins 201 have a double-row structure (arranged in two rows). A plurality of first pins 201 includes a plurality of third pins 2011 arranged in one row and a plurality of fourth pins 2012 arranged in another one row. The third pin 2011 is closer to the display region R1 than the fourth pin 2012 to the display region R1. Referring to FIG. 11B and FIG. 7A, the third pin 2011 may be bonded with the first signal output pad 1201, and the fourth pin 2012 may be bonded with the second signal output pad 1202. The signal input element 20 illustrated in FIG. 11B may be bonded with the signal input unit 13 and the signal output unit 12 illustrated in FIG. 7A, respectively.

Referring to FIG. 11A and FIG. 6, or, referring to FIG. 11B and FIG. 7A, in the display substrate DS3, orthographic projections of a plurality of test pads 110 on the base substrate BS are located within an orthographic projection of the signal input element 20 on the base substrate BS. In the final product, the plurality of test pads 110 are retained, and the plurality of test pads 110 is overlapped with the signal input element 20. For example, the plurality of test pads 110 is overlapped with the signal input element 20 in a direction perpendicular to the base substrate BS.

Figure 11C:
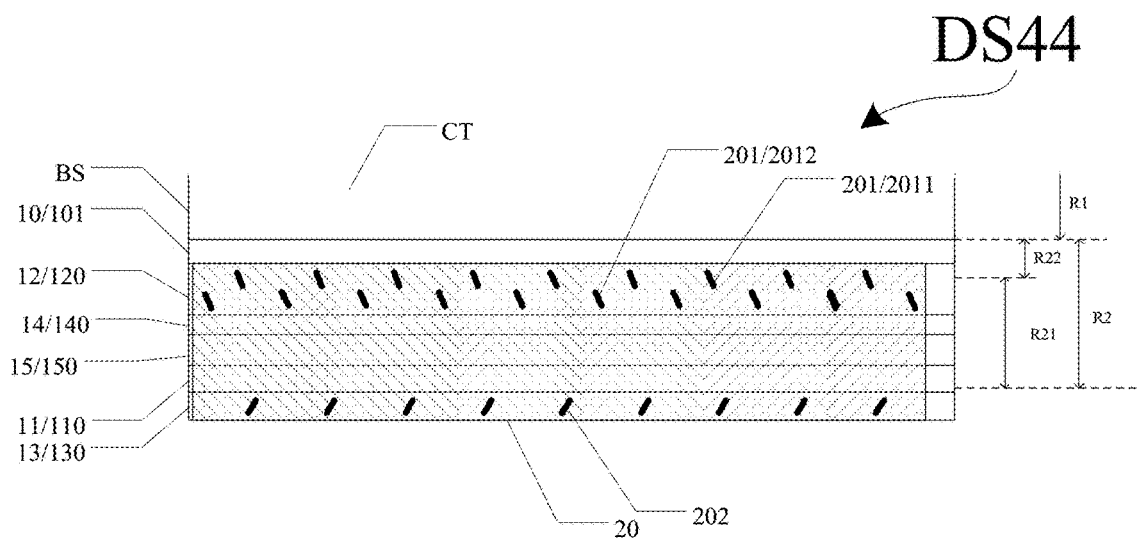
FIG. 11C is a schematic diagram illustrating a bonding position of a signal input element in a display substrate provided by an embodiment of the present disclosure.

FIG. 11C is a schematic diagram illustrating a bonding position of a signal input element in a display substrate provided by an embodiment of the present disclosure. The signal input element 20 in the display substrate DS44 may be bonded with the signal output unit 12 and the signal input unit 13 illustrated in FIG. 7B, respectively. Referring to FIG. 11C and FIG. 7B, the first pins 210 have a double-row structure (arranged in two rows). A plurality of first pins 201 includes a plurality of third pins 2011 arranged in one row and a plurality of fourth pins 2012 arranged in another one row. The third pin 2011 is closer to the display region R1 than the fourth pin 2012 to the display region R1. The third pin 2011 may be bonded with the first signal output pad 1202, and the fourth pin 2012 may be bonded with the second signal output pad 1202.

Figure 12:
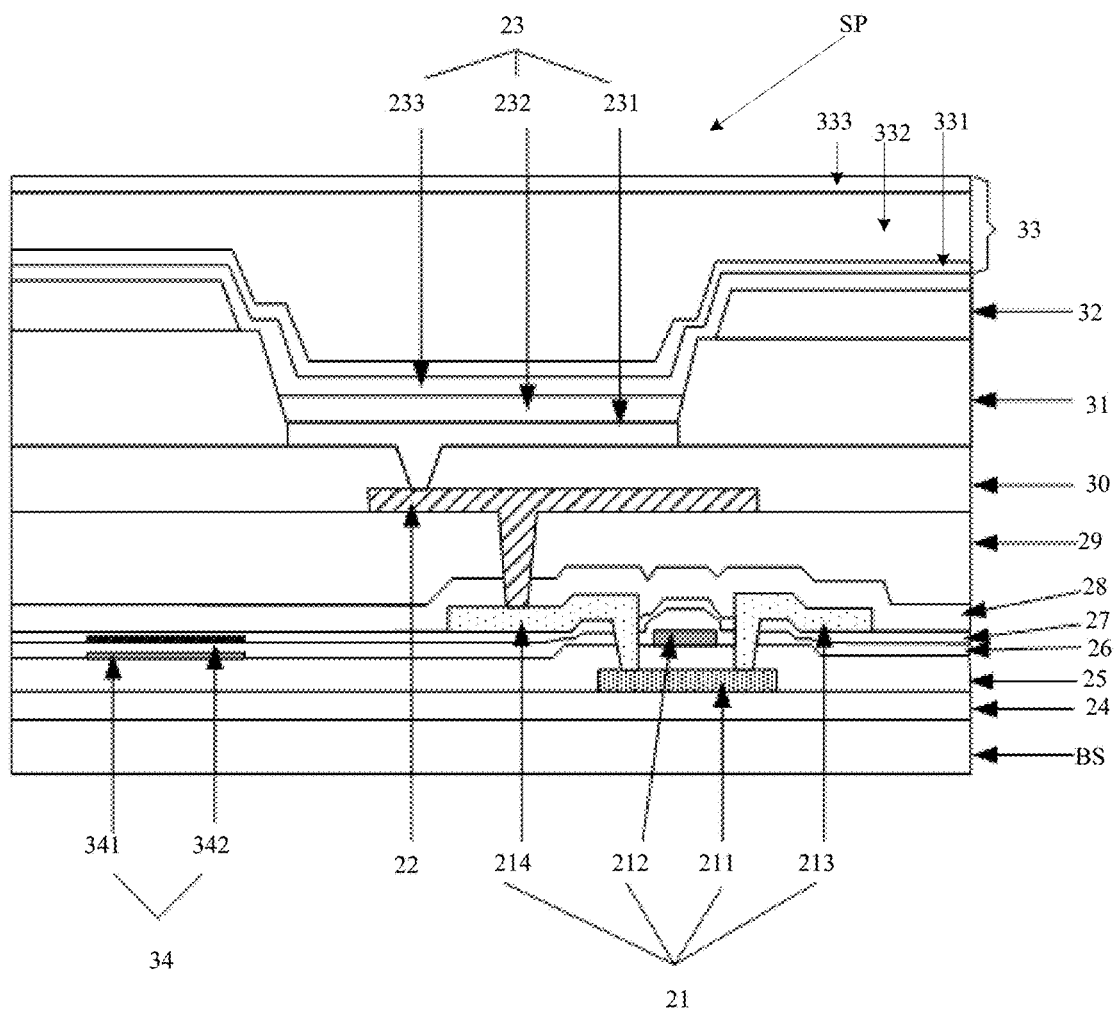
FIG. 12 is a schematic diagram of part of a display region of a display substrate provided by an embodiment of the present disclosure.

FIG. 12 is a schematic diagram of part of a display region of a display substrate provided by an embodiment of the present disclosure. As illustrated in FIG. 12, each of the sub-pixels SP includes a thin film transistor 21. The thin film transistor 21 includes an active layer 211 located on the base substrate BS, a gate electrode 212 located at a side of the active layer 211 away from the base substrate BS, and a source electrode 213 and a drain electrode 214 that are located at a side of the gate electrode 212 away from the base substrate BS. Between the thin film transistor 21 and the base substrate BS, a buffer layer 24 is provided. Between the active layer 211 and the gate electrode 212, a first gate insulating layer 25 is provided. Between the gate electrode 212 and a layer where the source electrode 213 and the drain electrode 214 are located, a second gate insulating layer 26 and an interlayer insulating layer 27 are provided. A passivation layer 28 covers the source electrode 213 and covers the drain electrode 214. A first planarization layer 29 is located on the passivation layer 28. A connecting electrode 22 is located on the first planarization layer 29. A second planarization layer 30 is located on the connecting electrode 22 and covers the connecting electrode 22. A first pixel defining layer 31 and a second pixel defining layer 32 are located on the second planarization layer 30 and include an opening penetrating both the first pixel defining layer 31 and the second pixel defining layer 32; an anode 231 is located inside the opening above, the anode 231 is connected with the connecting electrode 22 through a via hole penetrating the second planarization layer 30. On the anode 231, there are a light-emitting functional layer 232 and a cathode 233 formed sequentially. A light-emitting element 23 includes the anode 231, the light-emitting functional layer 232, and the cathode 233. The sub-pixel SP includes the light-emitting element 23 and the thin film transistor 21. The light-emitting functional layer 232 at least includes a light-emitting layer. The light-emitting functional layer 232 may further include at least one selected from the group consisting of a hole transportation layer, a hole injection layer, an electron transportation layer, and an electron injection layer, without limited thereto. The light-emitting element 23 is encapsulated from the above by using an encapsulating layer 33 to prevent moisture and oxide from corroding the light-emitting element 23. The encapsulating layer 33 at least includes a first encapsulating layer 331, a second encapsulating layer 332 and a third encapsulating layer 333. The second encapsulating layer 332 is located between the first encapsulating layer 331 and the third encapsulating layer 333. The second encapsulating layer 332 is an organic encapsulating layer, and both the first encapsulating layer 331 and the third encapsulating layer 333 are inorganic encapsulating layers. The display substrate may further include a first capacitance electrode 341 and a second capacitance electrode 342; the first capacitance electrode 341 and the second capacitance electrode 342 constitute a capacitor 34. The first capacitance electrode 341 may be located in the same layer as the gate electrode 212; the second capacitance electrode 342 may be located between the second gate insulating layer 26 and the interlayer insulating layer 27. For example, in the embodiment of the present disclosure, the data line DL, the source electrode 213, and the drain electrode 214 may be formed from the same film layer by using the same patterning process.

For example, structures such as the data line and the thin film transistor 21 are formed on the base substrate to form a backplane, the backplane is subject to an array test, and then the light-emitting element 23 is formed on the backplane having passed the array test to form a display substrate.

For example, referring to FIG. 12 and FIG. 7A, or, referring to FIG. 12 and FIG. 8, the first signal line L1, the second signal line L2, the first gate electrode 1513, the second gate electrode 1523, and the test pad 110 are located in the same layer as the gate electrode 212.

For example, referring to FIG. 12 and FIG. 7A, or, referring to FIG. 12 and FIG. 8, the first electrode 1511, the second electrode 1512, the third electrode 1521, the fourth electrode 1522, and the data signal transmission line DSTL are located in the same layer as the source electrode 213 of the thin film transistor 21 or the drain electrode 214 of the thin film transistor 21.

Figure 13:
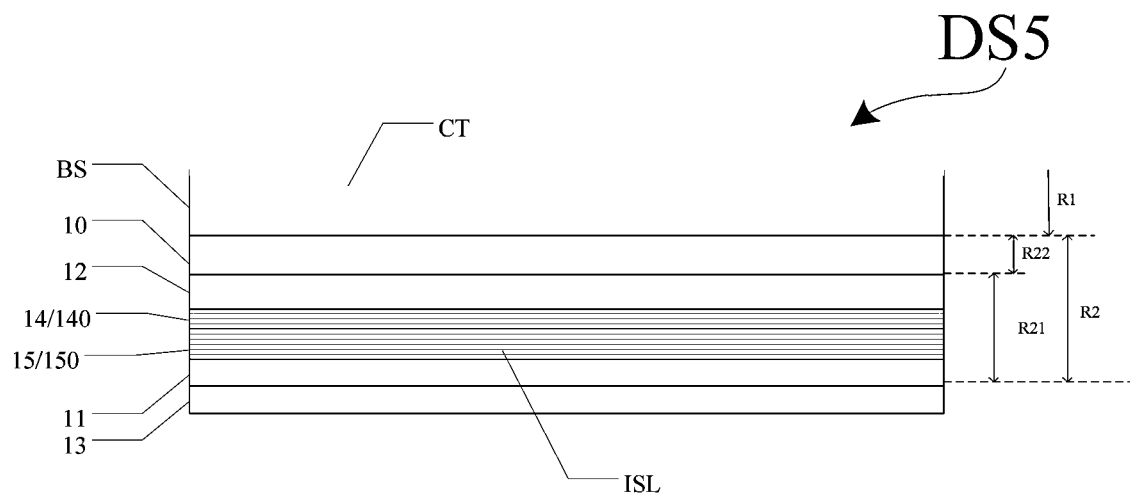
FIG. 13 is a plan view of a display substrate provided by an embodiment of the present disclosure.

FIG. 13 is a plan view of a display substrate provided by an embodiment of the present disclosure. Considering that a jump of signal during the array test may interrupt the signal on the data line, a protection measure may be adopted at the electrostatic release unit 15. An insulating layer may be utilized to cover the electrostatic release unit 15, without limited thereto. For example, the insulating layer ISL in the display substrate DS5 may cover a plurality of electrostatic release elements 150 to achieve protection and isolation. For example, a portion of at least one selected from the group consisting of a passivation layer 28, a first planarization layer 29, a second planarization layer 30, a first pixel defining layer 31, and a second pixel defining layer 32 that is located in the periphery region covers a plurality of electrostatic release elements 150. Of course, a multiplexer (MUX) unit (data selector unit) 14 (a plurality of MUXs 140) may also be covered by a portion of at least one selected from the group consisting of the passivation layer 28, the first planarization layer 29, the second planarization layer 30, the first pixel defining layer 31, and the second pixel defining layer 32 that is located in the periphery region. The embodiment illustrated in FIG. 13 is described with reference to the case where the insulating layer ISL covers a plurality of electrostatic release elements 150 of the electrostatic release unit 15 and covers a plurality of MUXs 140 of the MUX unit 14, by way of example.

For example, in the embodiment of the present disclosure, the first gate insulating layer 25, the second insulating layer 26, the interlayer insulating layer 27, the passivation layer 28, the first planarization layer 29, the second planarization layer 30, the first pixel defining layer 31, and the second pixel defining layer 32 are all made by an insulating material. For example, the insulating material includes at least one selected from the group consisting of silicon oxide, silicon nitride, silicon oxynitride, and resin. For example, the first gate insulating layer 25, the second insulating layer 26, the interlayer insulating layer 27, the passivation layer 28, the first planarization layer 29, the second planarization layer 30, and the second pixel defining layer 32 are made by adopting at least one selected from the group consisting of silicon oxide, silicon nitride, and silicon oxynitride. The first pixel defining layer 31 is made by adopting resin.

Figure 14:
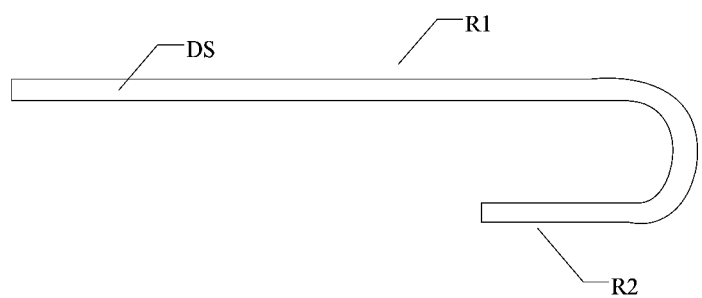
FIG. 14 is a schematic diagram of a display substrate provided by an embodiment of the present disclosure.

FIG. 14 is a schematic diagram of a display substrate provided by an embodiment of the present disclosure. For example, a portion of the display substrate DS located in the periphery region R2 is bent into a rear side of a portion of the display substrate DS located in the display region R1. For example, the rear side refers to a side of the display substrate DS opposite to a side where a plurality of sub-pixels is disposed. For example, the rear side refers to a side of the display substrate DS opposite to a side where a plurality of data lines is disposed. When the base substrate BS adopts a flexible base substate, it facilitates the operation of bending. The display device obtained after the bending process has a narrow bezel. At least one embodiment of the present disclosure provides a display device including any of the display substrates above.

For example, the display device may include an OLED display and any product or component that includes an OLED and has a display function such as a television, a digital camera, a mobile phone, a watch, a tablet computer, a notebook computer, and a navigator.

It should be explained that, for purpose of clarity, in the drawings for describing the embodiments of the present disclosure, the thickness of a layer or a region is enlarged. It's understandable that, when an element such as a layer, a film, a region and a substrate is referred to as being located "on" or "below" another element, the element may be "directly" located "on" or "below" another element, or an intermediate element may be provided therebetween.

In the embodiments of the present disclosure, the shape of each of the elements is merely described by way of example, and is not limited to that illustrated in the figures but may be determined according to requirements.

In the embodiments of the present disclosure, the patterning or patterning process may only include a photolithographic process, or may include the photolithographic process and an etching process, or may include other process (es) for forming a predetermined pattern such as a printing process and an ink-jetting process. The photolithographic process refers to a process which includes film forming, exposing and developing and which forms a pattern by utilizing a photoresist, a mask, an exposure machine and the like. A corresponding patterning process may be selected according to the structure(s) to be formed in the embodiments of the present disclosure.

In case of no conflict, the features in the same embodiment or in different embodiments can be combined with each other.

What have been described above are only specific implementations of the present disclosure, but the protection scope of the present disclosure is not limited thereto. All the changes or substitutions easily conceivable for any skilled who is familiar with the present technical field should be covered by the protection scope of the present disclosure. Therefore, the protection scope of the present disclosure should be based on the protection scope of the claims.

What is claimed is:

1. A display substrate, comprising:
   a base substrate, comprising a display region and a periphery region at least located at one side of the display region;

a plurality of sub-pixels, located in the display region;
a plurality of data lines, located in the display region, the plurality of data lines being electrically connected with the plurality of sub-pixels;
a plurality of data signal transmission lines, located in the periphery region, the plurality of data signal transmission lines being electrically connected with at least part of the plurality of data lines;
a plurality of signal output pads, located in the periphery region and located between the plurality of data lines and the plurality of data signal transmission lines, the plurality of signal output pads being electrically connected with the plurality of data lines, the plurality of data signal transmission lines being electrically connected with at least part of the plurality of signal output pads;
a plurality of signal input pads, located in the periphery region and located at a side of the plurality of signal output pads away from the display region;
a plurality of test pads, located between the plurality of signal output pads and the plurality of signal input pads, the plurality of test pads being connected with the plurality of data signal transmission lines, respectively, the plurality of test pads being configured to be connected with an external test device during a manufacturing process of the display substrate to detect the display substrate; and
a plurality of electrostatic release elements, located between the plurality of signal output pads and the plurality of test pads, the plurality of electrostatic release elements being connected with the plurality of data signal transmission lines, respectively, each of the plurality of electrostatic release elements being configured to release static electricity on the data signal transmission line that is connected with the electrostatic release element,
wherein the display substrate further comprises a signal input element, and orthographic projections of the plurality of electrostatic release elements on the base substrate are located within an orthographic projection of the signal input element on the base substrate,
wherein the plurality of signal output pads and the plurality of signal input pads are bonded with the signal input element, and the plurality of electrostatic release elements are closer to the base substrate than the signal input element.

2. The display substrate according to claim 1, wherein
the electrostatic release element comprises a first thin film transistor, a second thin film transistor, a first signal line, and a second signal line,
the first thin film transistor is connected with one data signal transmission line of the plurality of data signal transmission lines and is connected with the first signal line, respectively, and
the second thin film transistor is connected with the data signal transmission line and the second signal line, respectively.

3. The display substrate according to claim 2, wherein
the first thin film transistor comprises a first electrode and a second electrode, one of the first electrode and the second electrode is connected with the data signal transmission line, and the other one of the first electrode and the second electrode is connected with the first signal line; and
the second thin film transistor comprises a third electrode and a fourth electrode, one of the third electrode and the fourth electrode is connected with the data signal transmission line, and the other one of the third electrode and the fourth electrode is connected with the second signal line.

4. The display substrate according to claim 3, wherein
the first thin film transistor further comprises a first gate electrode, one of the first electrode and the second electrode is connected with the first gate electrode in a short circuit; and
the second thin film transistor further comprises a second gate electrode, one of the third electrode and the fourth electrode is connected with the second gate electrode in a short circuit.

5. The display substrate according to claim 2, wherein
the first thin film transistor further comprises a first semiconductor layer, the first electrode and the second electrode are electrically connected with the first semiconductor layer, respectively; and
the second thin film transistor further comprises a second semiconductor layer, the third electrode and the fourth electrode are electrically connected with the second semiconductor layer, respectively,
wherein
a width-to-length ratio of a channel of the first semiconductor layer is in a range of 0.2-0.5, and
a width-to-length ratio of a channel of the second semiconductor layer is in a range of 0.2-0.5.

6. The display substrate according to claim 2, wherein
two first thin film transistors are provided, one of the two first thin film transistors is located at a side of the other one of the two first thin film transistors away from the display region; and
two second thin film transistors are provided, one of the two second thin film transistors is located at a side of the other one of the two second thin film transistors away from the display region.

7. The display substrate according to claim 4, wherein the first thin film transistor and the second thin film transistor are connected through the data signal transmission line,
wherein the data signal transmission line is intersected with the first signal line and the second signal line, respectively.

8. The display substrate according to claim 1, further comprising a plurality of multiplexers, wherein
a first end of each of the plurality of multiplexers is electrically connected with the data signal transmission line, and a second end of the multiplexer is electrically connected with at least two signal output pads of the plurality of signal output pads.

9. The display substrate according to claim 1, wherein the plurality of signal output pads comprise a first signal output pad and a second signal output pad,
the first signal output pad and the second signal output pad are connected with two different signal lines, respectively, and
the first signal output pad is closer to the display region than the second signal output pad to the display region.

10. The display substrate according to claim 9, wherein an included angle between the first signal output pad and the second signal output pad is greater than 90° and is smaller than or equal to 135°.

11. A display substrate, comprising:
a base substrate, comprising a display region and a periphery region at least located at one side of the display region;
a plurality of sub-pixels, located in the display region;

a plurality of data lines, located in the display region, the plurality of data lines being electrically connected with the plurality of sub-pixels;

a plurality of data signal transmission lines, located in the periphery region, the plurality of data signal transmission lines being electrically connected with at least part of the plurality of data lines;

a plurality of signal output pads, located in the periphery region and located between the plurality of data lines and the plurality of data signal transmission lines, the plurality of signal output pads being electrically connected with the plurality of data lines, the plurality of data signal transmission lines being electrically connected with at least part of the plurality of signal output pads;

a plurality of signal input pads, located in the periphery region and located at a side of the plurality of signal output pads away from the display region, the plurality of signal output pads and the plurality of signal input pads being configured to be bonded with a signal input element;

a plurality of test pads, located between the plurality of signal output pads and the plurality of signal input pads, the plurality of test pads being connected with the plurality of data signal transmission lines, respectively, the plurality of test pads being configured to be connected with an external test device during a manufacturing process of the display substrate to detect the display substrate; and a plurality of electrostatic release elements, located between the plurality of signal output pads and the plurality of test pads, the plurality of electrostatic release elements being connected with the plurality of data signal transmission lines, respectively, each of the plurality of electrostatic release elements being configured to release static electricity on the data signal transmission line that is connected with the electrostatic release element, wherein the plurality of signal output pads comprise a plurality of first signal output pads and a plurality of second signal output pads, the plurality of first signal output pads are arranged alternately with the plurality of second signal output pads, the plurality of second signal output pads are closer to the plurality of test pads than the plurality of first signal output pads to the plurality of test pads, and the plurality of second signal output pads are connected with the plurality of data signal transmission lines, while the plurality of first signal output pads are not connected with the plurality of data signal transmission lines.

12. The display substrate according to claim 11, wherein at least one sub-pixel of the plurality of sub-pixels comprises a thin film transistor;

the thin film transistor comprises an active layer located on the base substrate, a gate electrode located at a side of the active layer away from the base substrate, and a source electrode and a drain electrode that are located at a side of the gate electrode away from the base substrate;

the first signal line, the second signal line, the first gate electrode, and the second gate electrode are located in a same layer as the gate electrode; and the first electrode, the second electrode, the third electrode, the fourth electrode, and the plurality of data signal transmission lines are located in a same layer as the source electrode of the thin film layer, or located in a same layer as the drain electrode of the thin film transistor.

13. The display substrate according to claim 8, wherein the plurality of multiplexers are located between the plurality of signal output pads and the plurality of electrostatic release elements.

14. The display substrate according to claim 1, further comprising an insulating layer, wherein the insulating layer covers the plurality of electrostatic release elements.

15. The display substrate according to claim 1, wherein orthographic projections of the plurality of electrostatic release elements on the base substrate are completely located within an orthographic projection of the signal input element on the base substrate.

16. The display substrate according to claim 15, wherein the signal input element comprises a plurality of first pins and a plurality of second pins, the plurality of first pins are electrically connected with the plurality of signal output pads, respectively, and the plurality of second pins are electrically connected with the plurality of signal input pads, respectively.

17. The display substrate according to claim 15, wherein orthographic projections of the plurality of test pads on the base substrate are located within the orthographic projection of the signal input element on the base substrate.

18. The display substrate according to claim 1, wherein a portion of the display substrate located in the periphery region is bent to a rear side of a portion of the display substrate located in the display region.

19. A display substrate, comprising:

a base substrate, comprising a display region and a periphery region at least located at one side of the display region;

a plurality of sub-pixels, located in the display region;

a plurality of data lines, located in the display region, the plurality of data lines being electrically connected with the plurality of sub-pixels;

a plurality of data signal transmission lines, located in the periphery region, the plurality of data signal transmission lines being electrically connected with at least part of the plurality of data lines;

a plurality of signal output pads, located in the periphery region and located between the plurality of data lines and the plurality of data signal transmission lines, the plurality of signal output pads being electrically connected with the plurality of data lines, the plurality of data signal transmission lines being electrically connected with at least part of the plurality of signal output pads;

a plurality of signal input pads, located in the periphery region and located at a side of the plurality of signal output pads away from the display region, the plurality of signal output pads and the plurality of signal input pads being configured to be bonded with a signal input element;

a plurality of test pads, located between the plurality of signal output pads and the plurality of signal input pads, the plurality of test pads being connected with the plurality of data signal transmission lines, respectively, the plurality of test pads being configured to be connected with an external test device during a manufacturing process of the display substrate to detect the display substrate; and a plurality of electrostatic release elements, located between the plurality of signal output pads and the plurality of test pads, the plurality of electrostatic release elements being connected with the plurality of data signal transmission lines, respectively, each of the plurality of electrostatic release elements being configured to release static electricity on the data signal transmission line that is connected with the electrostatic release element, wherein a ratio of a spaced distance between two adjacent test pads to a width of each of the plurality of test pads is 1:2.

20. A display device, comprising the display substrate according to claim 1.

* * * * *